US012696604B2

(12) United States Patent　　　　　(10) Patent No.: US 12,696,604 B2
Lee et al.　　　　　　　　　　　　　　(45) Date of Patent: Jul. 28, 2026

(54) DISPLAY DEVICE AND TILED DISPLAY DEVICE INCLUDING THE SAME

(71) Applicant: Samsung Display Co., LTD., Yongin-si (KR)

(72) Inventors: Seul Gee Lee, Seoul (KR); Tae Min Kim, Hwaseong-si (KR); Bong Sung Seo, Suwon-si (KR); Dong Geun Shin, Hwaseong-si (KR); Gi Hoon Yang, Hwaseong-si (KR); Seung Hee Lee, Hwaseong-si (KR); Ho Lim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 880 days.

(21) Appl. No.: 17/708,630

(22) Filed: Mar. 30, 2022

(65) Prior Publication Data

US 2023/0009629 A1　　　Jan. 12, 2023

(30) Foreign Application Priority Data

Jun. 28, 2021　　(KR) ........................ 10-2021-0083768

(51) Int. Cl.
| | |
|---|---|
| *H01L 27/15* | (2006.01) |
| *H10H 20/84* | (2025.01) |
| *H10H 20/851* | (2025.01) |
| *H10H 29/14* | (2025.01) |

(52) U.S. Cl.
CPC .......... *H10H 29/142* (2025.01); *H10H 20/84* (2025.01); *H10H 20/851* (2025.01)

(58) Field of Classification Search
None
See application file for complete search history.

(56) References Cited

U.S. PATENT DOCUMENTS

| | | | |
|---|---|---|---|
| 11,744,114 B2 | 8/2023 | Baek et al. | |
| 2009/0168184 A1* | 7/2009 | Yamada ................. | G02B 1/115 |
| | | | 359/601 |
| 2010/0165460 A1* | 7/2010 | Furui ................ | G02F 1/133502 |
| | | | 359/488.01 |
| 2014/0255832 A1* | 9/2014 | Qiu ...................... | C09D 183/06 |
| | | | 523/435 |
| 2018/0219183 A1* | 8/2018 | Song .................. | H10K 59/8731 |
| 2019/0056530 A1* | 2/2019 | Liu .......................... | G02B 1/115 |
| 2019/0324341 A1* | 10/2019 | Tonar .................... | B32B 27/365 |

(Continued)

FOREIGN PATENT DOCUMENTS

| | | |
|---|---|---|
| JP | 2007-193323 A | 8/2007 |
| KR | 10-2012-0035063 A | 4/2012 |

(Continued)

*Primary Examiner* — Anthony J Frost
(74) *Attorney, Agent, or Firm* — Womble Bond Dickinson (US) LLP

(57) ABSTRACT

The display device comprises a light emitting element layer on a substrate and configured to emit light, a wavelength control layer on the light emitting element layer and configured to convert a wavelength of the light, a color filter layer on the wavelength control layer, and an anti-reflection layer on the color filter layer, wherein the anti-reflection layer includes a first inorganic layer on the color filter layer, a second inorganic layer on the first inorganic layer, and a coating layer on the second inorganic layer and including a dye.

19 Claims, 16 Drawing Sheets

(56) References Cited

U.S. PATENT DOCUMENTS

2021/0043691 A1* 2/2021 Yoon ..................... H10K 59/38
2021/0288230 A1 9/2021 Lee et al.
2023/0403887 A1 12/2023 Baek et al.

FOREIGN PATENT DOCUMENTS

KR    10-2014-0017274 A    2/2014
KR    10-1656103 B1    9/2016
KR    10-2018-0012104 A    2/2018
KR    20180067884 A  *  6/2018  .......... G09G 3/3233
KR    2020-0006206 A    1/2020
KR    2021-0042195 A    4/2021
KR    2022-0138546 A    10/2022

* cited by examiner

FIG. 2

PX: SPX1, SPX2, SPX3
EL: EL1, EL2, EL3

FIG. 10

DISPLAY DEVICE AND TILED DISPLAY DEVICE INCLUDING THE SAME

CROSS-REFERENCE TO RELATED APPLICATION

This application claims priority to and the benefit of Korean Patent Application No. 10-2021-0083768 filed on Jun. 28, 2021 in the Korean Intellectual Property Office, the entire content of which is incorporated herein by reference.

BACKGROUND

1. Field

One or more aspects of embodiments of the present disclosure relate to a display device and a tiled display device including the same.

2. Description of the Related Art

The importance of display devices has steadily increased with the development of multimedia technology. In response thereto, various display devices such as an organic light emitting display (OLED), a liquid crystal display (LCD) and/or the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode may include an organic light emitting diode (OLED) using an organic material as a light emitting material and an inorganic light emitting diode using an inorganic material as a light emitting material.

SUMMARY

One or more aspects of embodiments of the present disclosure provide a display device capable of reducing a reflectance of external light and improving display quality, and a tiled display device including the same.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments of the disclosure, a display device may comprise a light emitting element layer on a substrate and configured to emit light, a wavelength control layer on the light emitting element layer and configured to convert a wavelength of the light, a color filter layer on the wavelength control layer, and an anti-reflection layer on the color filter layer, wherein the anti-reflection layer may include a first inorganic layer on the color filter layer, a second inorganic layer on the first inorganic layer, and a coating layer on the second inorganic layer and including a dye.

In one or more embodiments, a refractive index of the first inorganic layer may be smaller than or equal to a refractive index of the second inorganic layer.

In one or more embodiments, the refractive index of the first inorganic layer may be 1.4 to 1.6, and the refractive index of the second inorganic layer may be 1.6 to 2.2.

In one or more embodiments, the refractive index of the second inorganic layer may be greater than a refractive index of the coating layer.

In one or more embodiments, the refractive index of the coating layer may be 1.2 to 1.5.

In one or more embodiments, the first inorganic layer may include silicon oxide or silicon nitroxide, and the second inorganic layer may include silicon nitride or silicon nitroxide.

In one or more embodiments, the coating layer may include a base material including a polyhedral oligomeric silsesquioxane (POSS)-based organic-inorganic composite material and hollow particles in the base material.

In one or more embodiments, the base material may include at least one of Chemical Formulae A, B, or C:

Chemical Formula A

Chemical Formula B

Chemical Formula C where X may be independently R or $[(SiO_{3/2}R)_{4+2n}O]$, R may be independently selected from the group consisting of hydrogen, deuterium, halogen, amine group, epoxy group, cyclohexyl epoxy group, acryl group, methacrylic group, thiol group, isocyanate group, nitrile group, nitro group, phenyl group, $C_1$~$C_{12}$ alkyl group, $C_2$~$C_{12}$ alkenyl group, $C_1$~$C_{40}$ alkoxy group, $C_3$~$C_{12}$ cycloalkyl group, $C_3$~$C_{12}$ heterocycloalkyl group, $C_6$~$C_{12}$ aryl group, $C_3$~$C_{12}$ heteroaryl group, $C_3$~$C_{12}$ aralkyl group, $C_3$~$C_{12}$ aryloxy group, and $C_3$~$C_{12}$ aryl thiol group, the phenyl group being substituted or unsubstituted, and the substituent being selected from the group consisting of deuterium, halogen, amine group, epoxy group, cyclohexyl epoxy group, acryl group, methacrylic group, thiol group, isocyanate group, nitrile group, and nitro group.

In one or more embodiments, the base material may include any of compounds represented by Chemical Formulae 1 to 9:

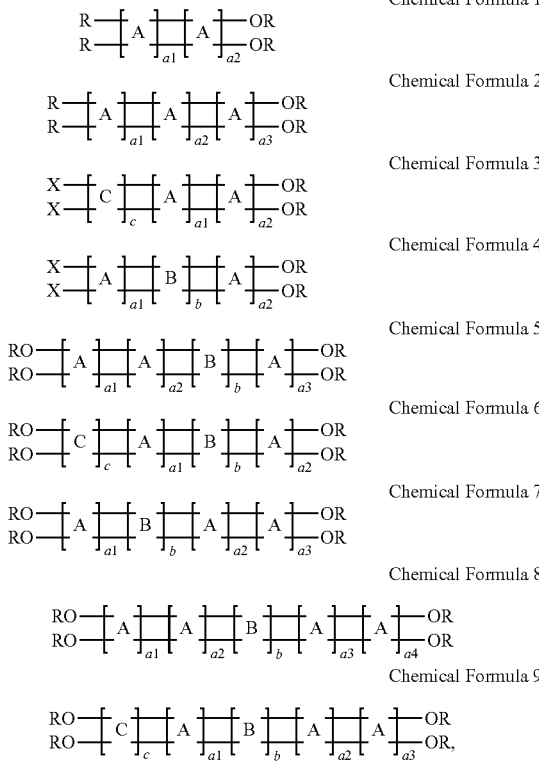

Chemical Formula 1

Chemical Formula 2

Chemical Formula 3

Chemical Formula 4

Chemical Formula 5

Chemical Formula 6

Chemical Formula 7

Chemical Formula 8

Chemical Formula 9 where R may be independently selected from the group consisting of hydrogen, deuterium, halogen, amine group, epoxy group, cyclohexyl epoxy group, acryl group, methacrylic group, thiol group, isocyanate group, nitrile group, nitro group, phenyl group, $C_1 \sim C_{12}$ alkyl group, $C_2 \sim C_{12}$ alkenyl group, $C_1 \sim C_{40}$ alkoxy group, $C_3 \sim C_{12}$ cycloalkyl group, $C_3 \sim C_{12}$ heterocycloalkyl group, $C_6 \sim C_{12}$ aryl group, $C_3 \sim C_{12}$ heteroaryl group, $C_3 \sim C_{12}$ aralkyl group, $C_3 \sim C_{12}$ aryloxy group, and $C_3 \sim C_{12}$ aryl thiol group, the phenyl group being substituted or unsubstituted, and the substituent being selected from the group consisting of deuterium, halogen, amine group, epoxy group, cyclohexyl epoxy group, acryl group, methacrylic group, thiol group, isocyanate group, nitrile group, and nitro group, X may be independently R or $[(SiO_{3/2}R)_{4+2n}O]$, and a1, a2, a3, a4, b, and c may be each independently an integer from 1 to 1000.

In one or more embodiments, the hollow particles may include at least one selected from the group consisting of hollow silica, hollow acrylic polymer, hollow vinyl polymer, and hollow epoxy polymer.

In one or more embodiments, each of the first inorganic layer, the second inorganic layer, and the coating layer may have a thickness of 50 to 200 nm.

In one or more embodiments, the display device may further comprise a circuit layer including at least one transistor between the substrate and the light emitting element layer.

In one or more embodiments, the light emitting element layer may include a first electrode and a second electrode on the substrate and extending in one direction, a light emitting element having a first end and a second end on the first electrode and the second electrode, respectively, and a first connection electrode in contact with the first end of the light emitting element and a second connection electrode in contact with the second end of the light emitting element.

In one or more embodiments, the light emitting element layer may include a pixel electrode on the substrate, a light emitting layer on the pixel electrode, and a common electrode on the light emitting layer.

According to one or more embodiments of the disclosure, a tiled display device may comprise a plurality of display devices adjacent to each other, and a bonding member on adjacent side surfaces of the plurality of display devices, wherein each of the plurality of display devices may include a light emitting element layer on a substrate and configured to emit light, a wavelength control layer on the light emitting element layer and configured to convert a wavelength of the light, a color filter layer on the wavelength control layer, and an anti-reflection layer on the color filter layer and including a first inorganic layer on the color filter layer, a second inorganic layer on the first inorganic layer, and a coating layer on the second inorganic layer, the coating layer including a dye.

In one or more embodiments, the bonding member may be configured to bond side surfaces of the respective coating layers of the plurality of display devices.

In one or more embodiments, a refractive index of the first inorganic layer may be smaller than or equal to a refractive index of the second inorganic layer, the refractive index of the first inorganic layer may be 1.4 to 1.6, and the refractive index of the second inorganic layer may be 1.6 to 2.2.

In one or more embodiments, the refractive index of the second inorganic layer may be greater than a refractive index of the coating layer, and the refractive index of the coating layer may be 1.2 to 1.5.

In one or more embodiments, the first inorganic layer may include silicon oxide or silicon nitroxide, and the second inorganic layer may include silicon nitride or silicon nitroxide.

In one or more embodiments, the coating layer may include a base material including a polyhedral oligomeric silsesquioxane (POSS)-based organic-inorganic composite material and hollow particles in the base material.

In the display device according to embodiments, an anti-reflection layer may be on one surface of the display device on which external light is incident, thereby reducing the reflectance of the external light incident on the display device.

In addition, in the tiled display device according to embodiments, the anti-reflection layer may be directly on one surface of each display device, thereby minimizing or reducing a gap between the display devices to improve display quality.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in more detail embodiments thereof with reference to the attached drawings, in which:

FIG. 2 is a schematic cross-sectional view of a display device according to one or more embodiments;

5

6

Figure 3:
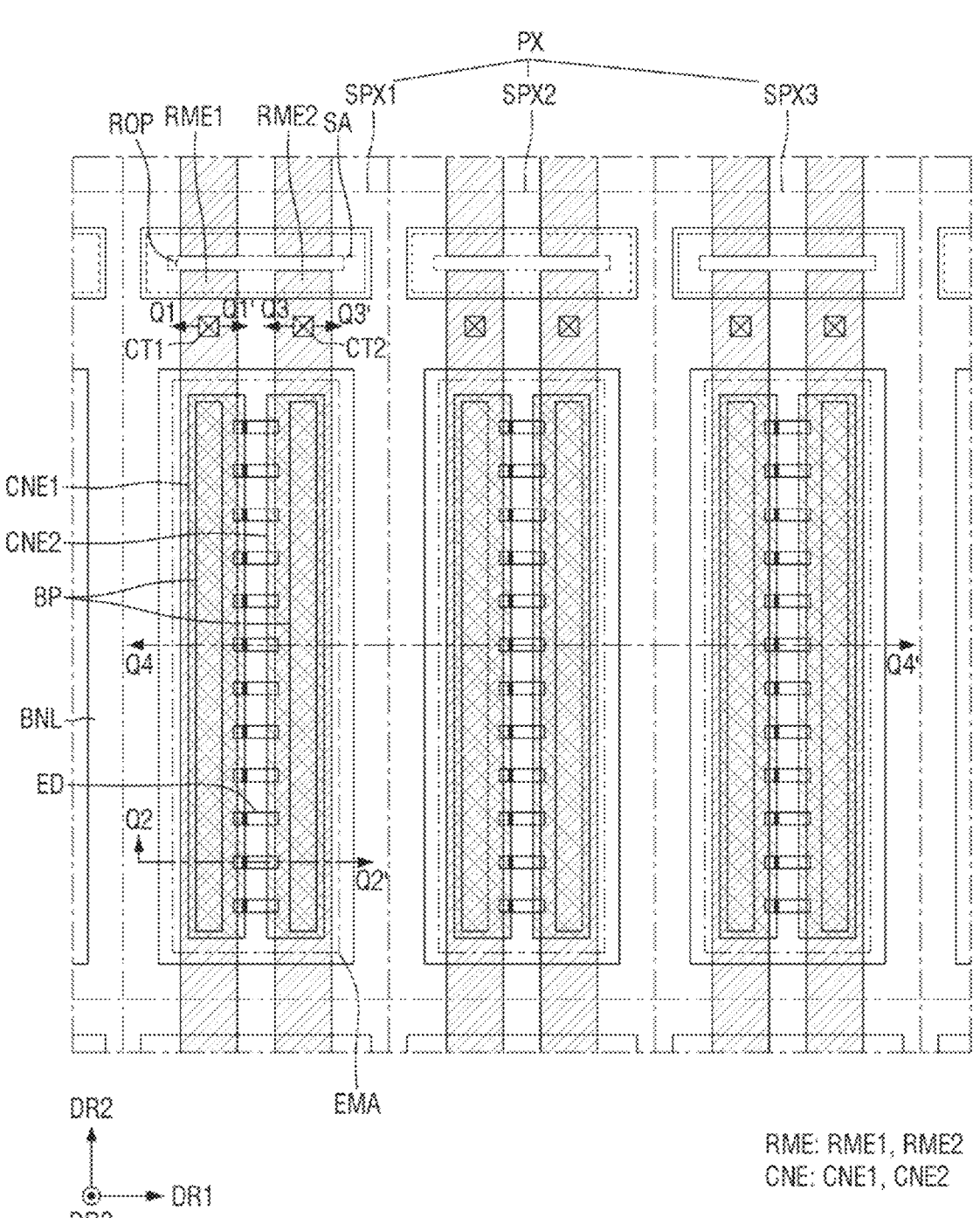
FIG. 3 is a schematic plan view illustrating a light emitting element layer in one pixel of a display device according to one or more embodiments.
Figure 4:
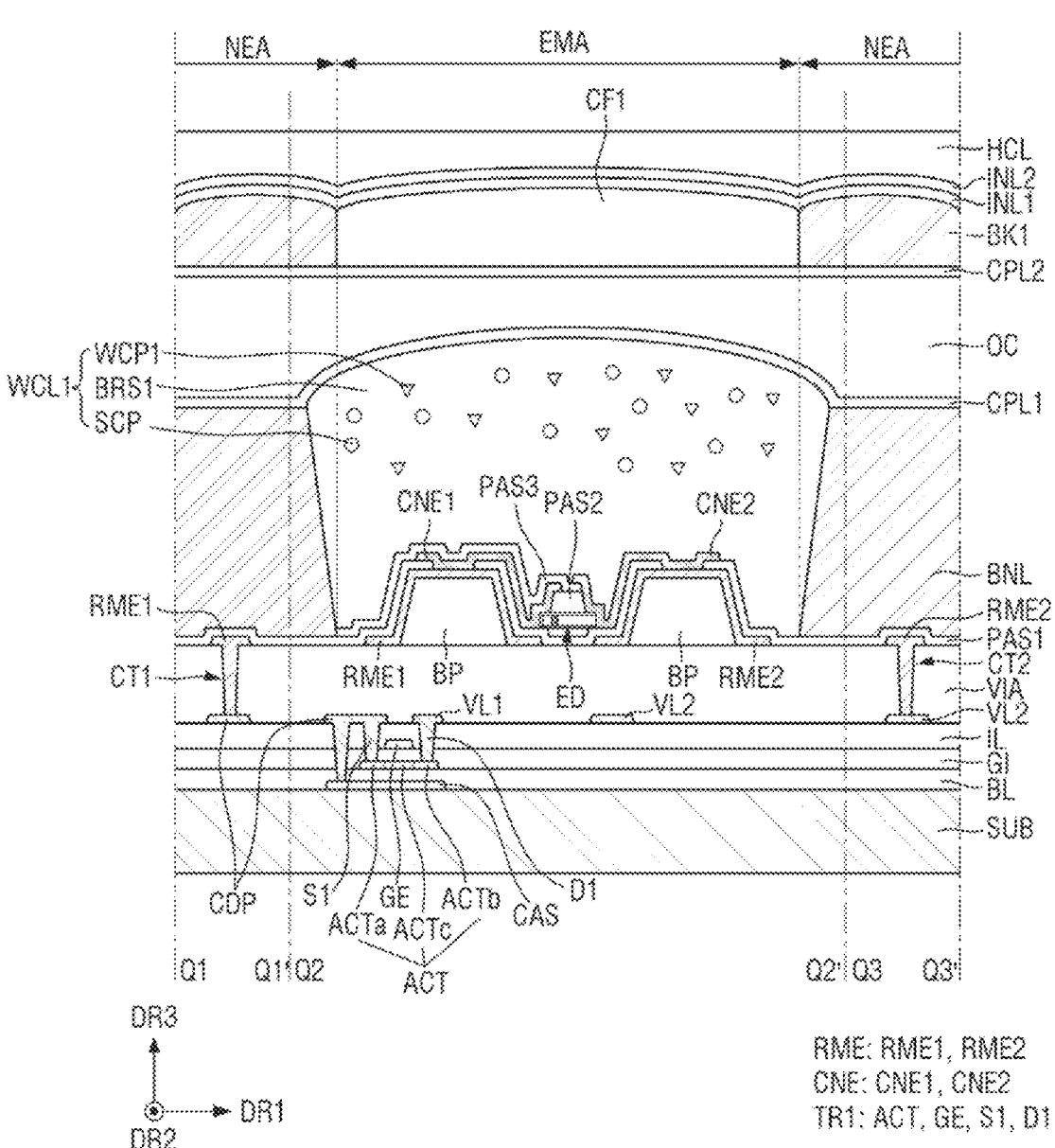
Figure 5:
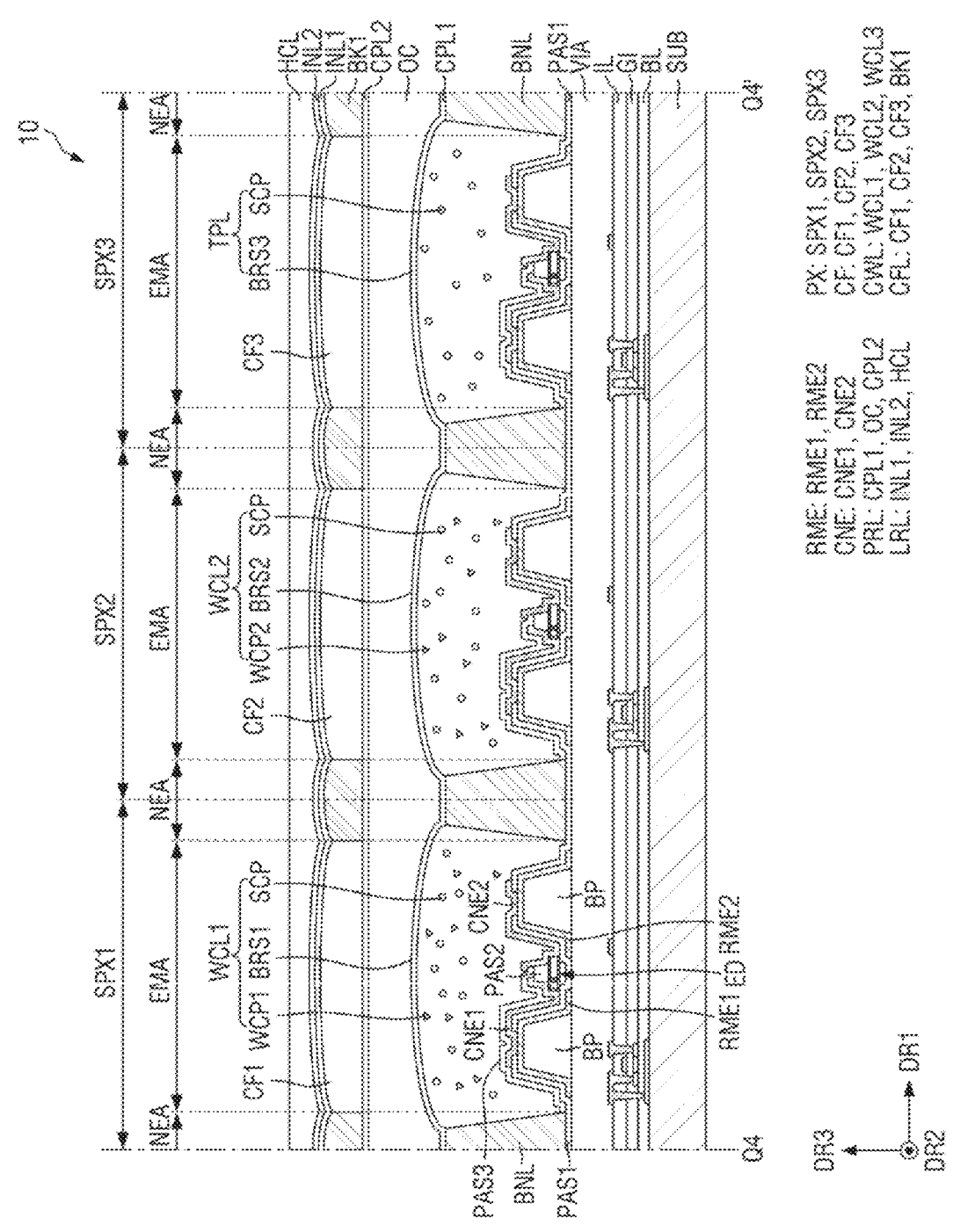
Figure 6:
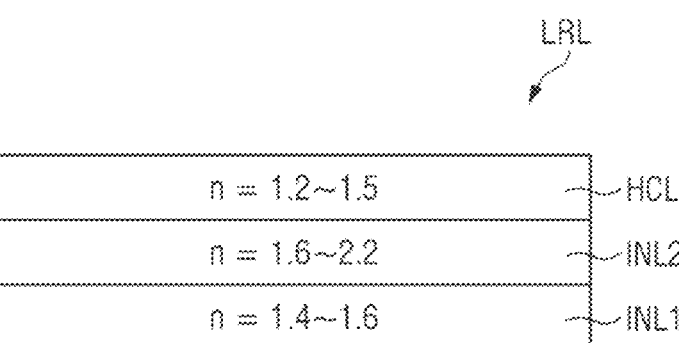
Figure 7:
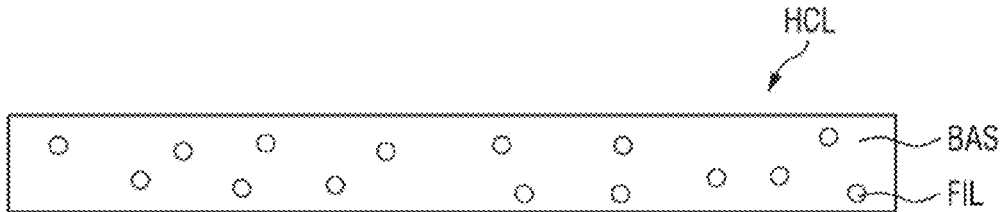
Figure 8:
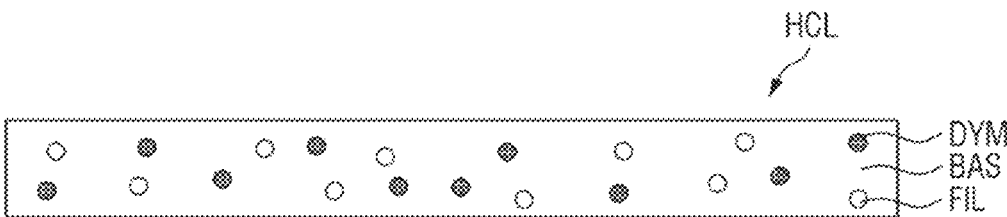
Figure 9:
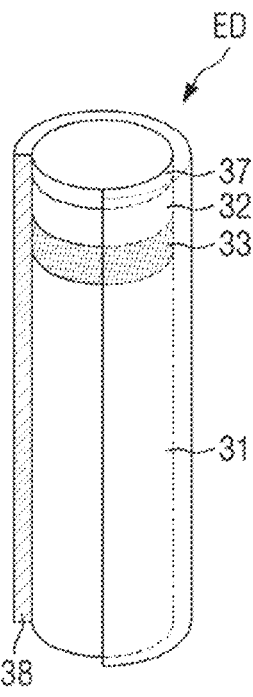
Figure 11:
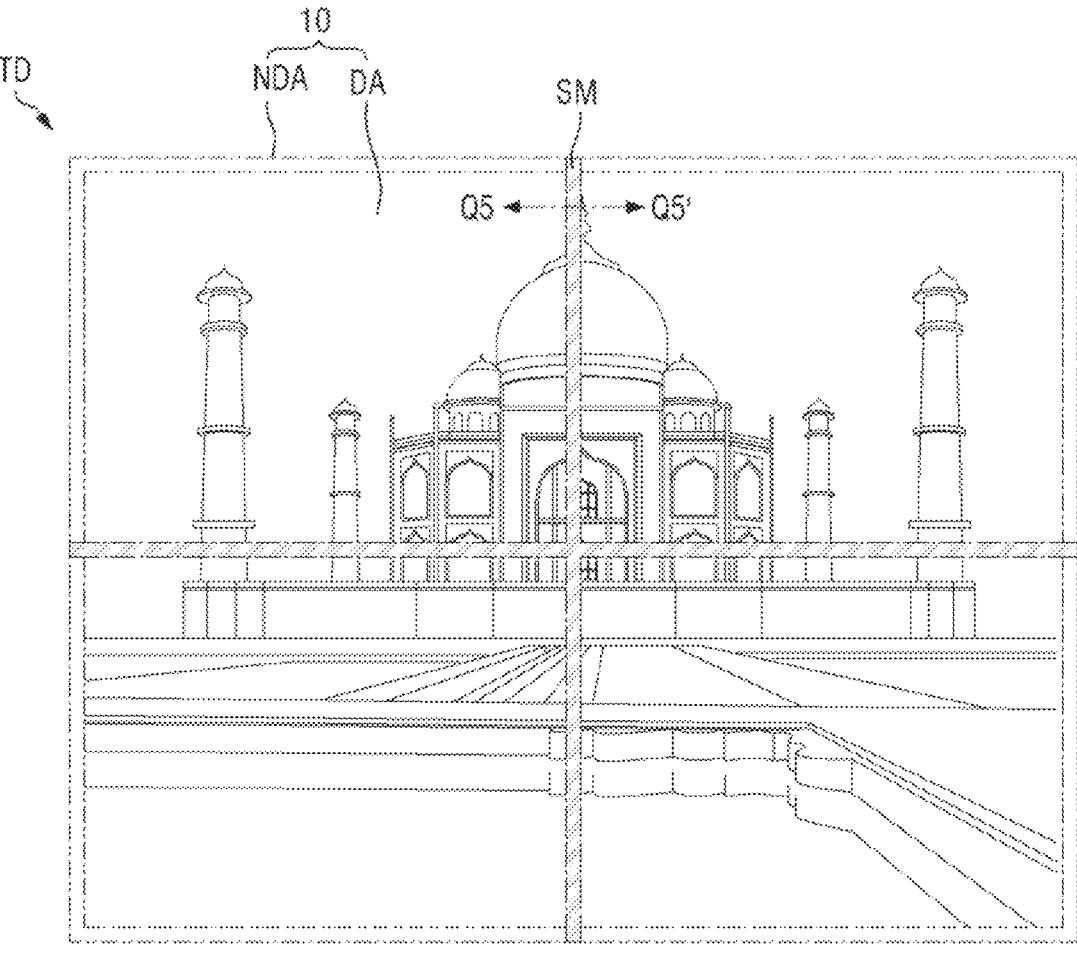
Figure 11:
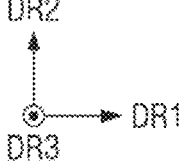
Figure 12:
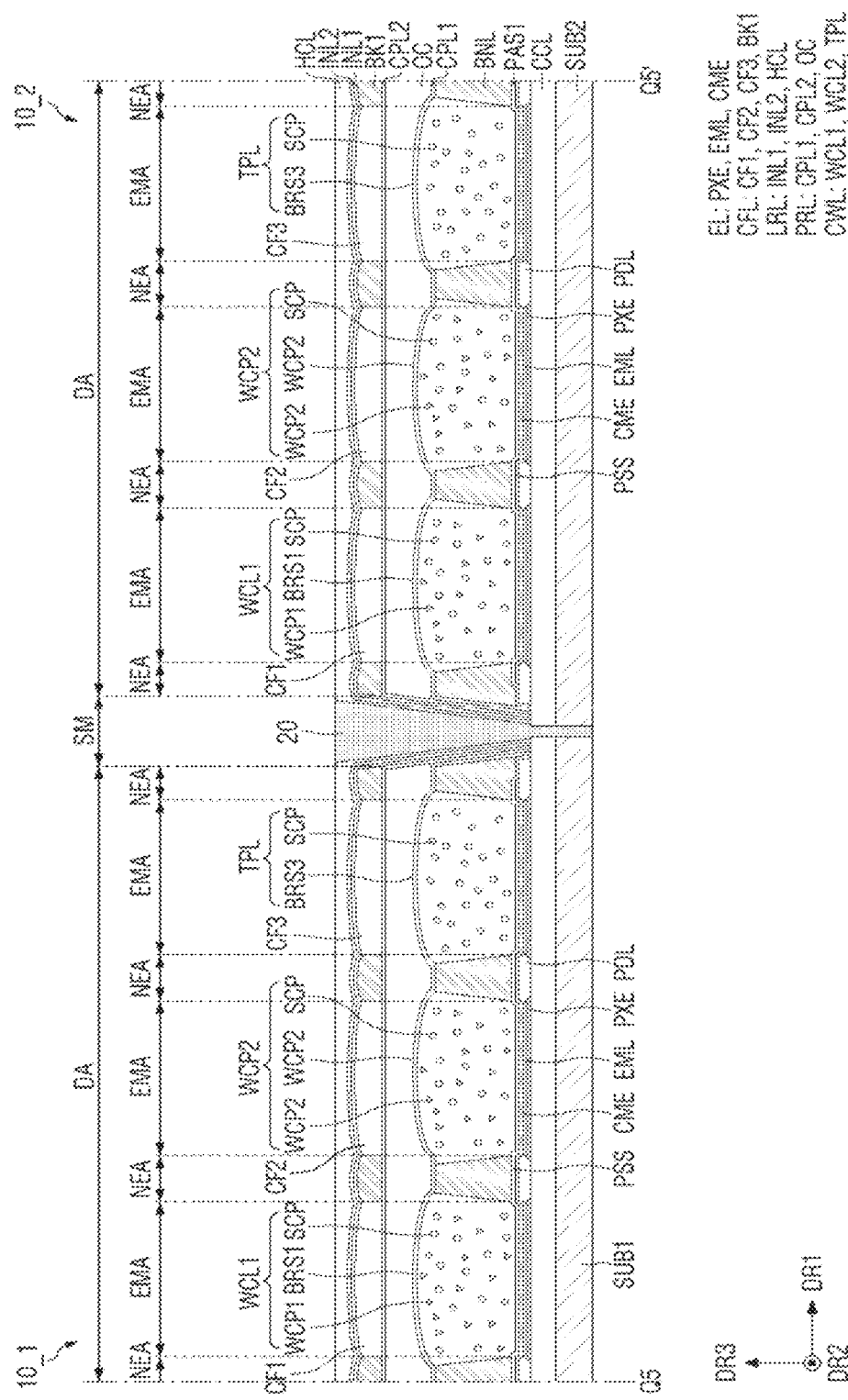
Figure 13:
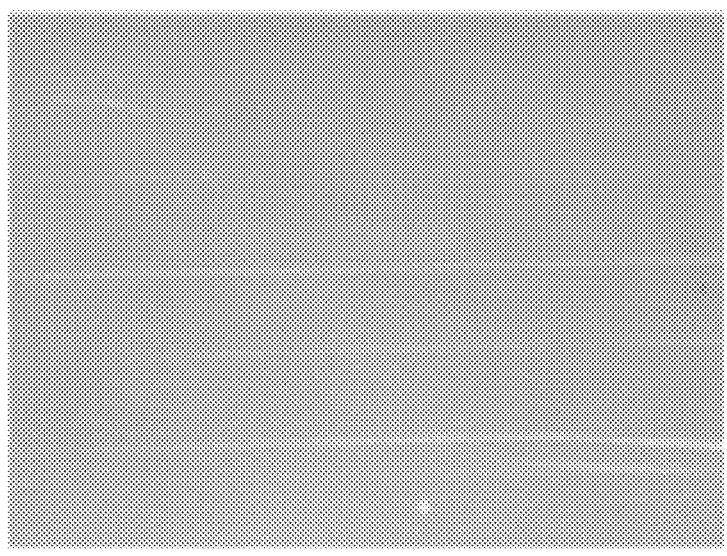
Figure 14:
Figure 15:
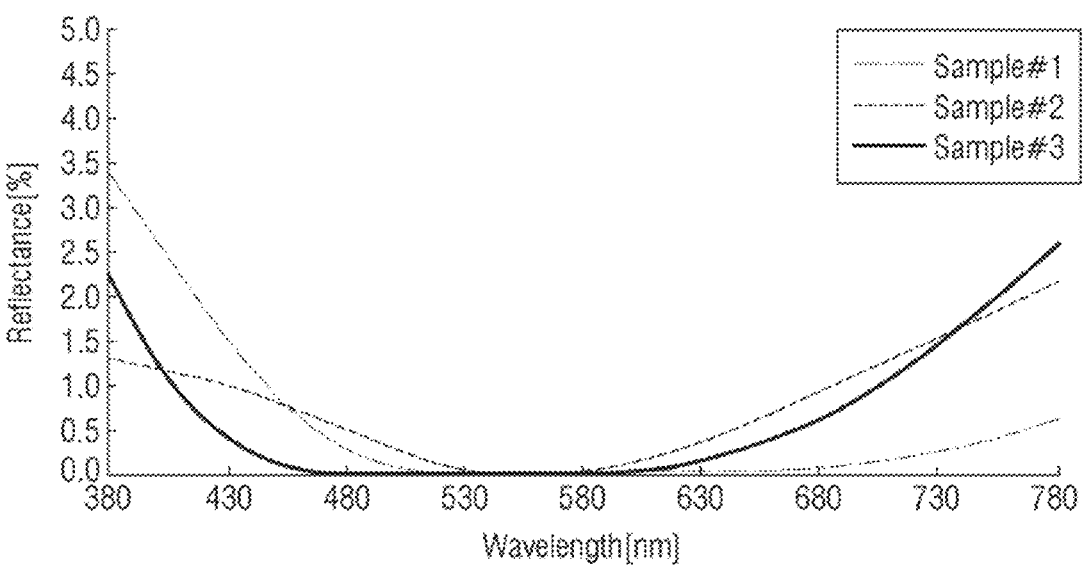
Figure 16:
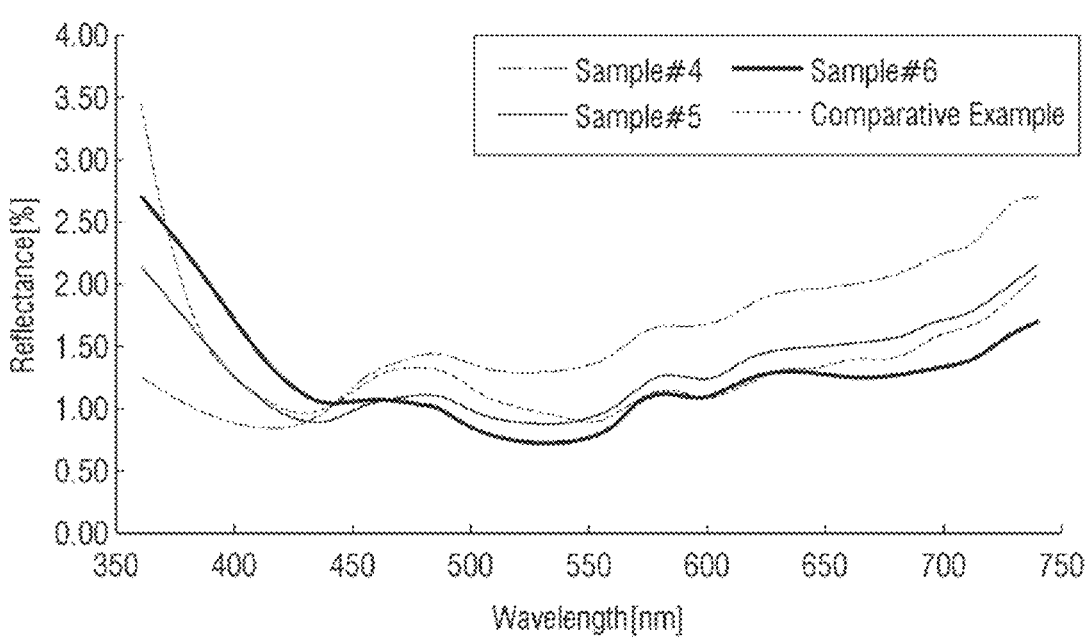

FIG. 4 is a cross-sectional view taken along the lines Q1-Q1', Q2-Q2', and Q3-Q3' of FIG. 3;

FIG. 5 is a cross-sectional view taken along the line Q4-Q4' of FIG. 3;

FIG. 6 is a cross-sectional view illustrating an anti-reflection layer in a display device according to one or more embodiments;

FIG. 7 is a cross-sectional view illustrating a coating layer of an anti-reflection layer according to one or more embodiments;

FIG. 8 is a cross-sectional view illustrating a coating layer of an anti-reflection layer according to one or more other embodiments;

FIG. 9 is a perspective view schematically illustrating a light emitting element in a display device according to one or more embodiments;

Figure 10:
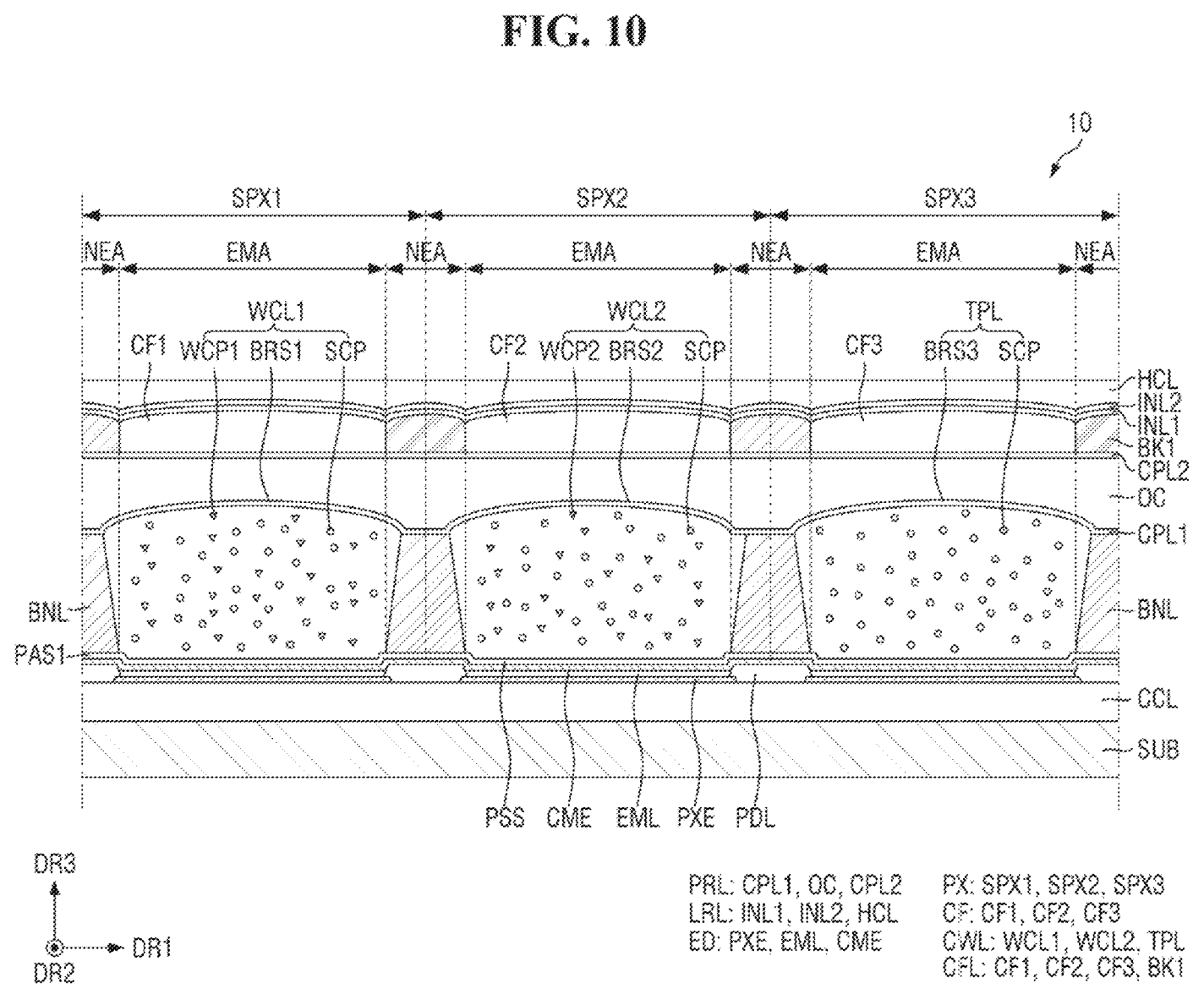

FIG. 10 is a cross-sectional view schematically illustrating a display device according to one or more other embodiments;

FIG. 11 is a plan view illustrating a tiled display device according to one or more embodiments;

FIG. 12 is a cross-sectional view taken along the line Q5-Q5' of FIG. 11;

FIG. 13 is a surface image of an ELR film;

FIG. 14 is a surface image of a coating layer sample;

FIG. 15 is a graph showing reflectance for each wavelength band between 380 nm and 780 nm for Samples #1, #2, and #3; and FIG. 16 is a graph showing reflectance for each wavelength band in substrate samples prepared according to Samples #4, #5, and #6 and Comparative Example.

DETAILED DESCRIPTION

The present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate (without any intervening layers therebetween), or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list. For example, "at least one of a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the term "and/or" includes any and all combinations of one or more of the associated listed items.

Further, the use of "may" when describing embodiments of the present disclosure refers to "one or more embodiments of the present disclosure".

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Each of the features of the various embodiments of the present disclosure may be combined with each other, in part or in whole, and variations are possible. Each embodiment may be implemented independently of each other or may be implemented together in combination with one or more other embodiments.

Hereinafter, embodiments will be described in more detail with reference to the accompanying drawings.

Figure 1:
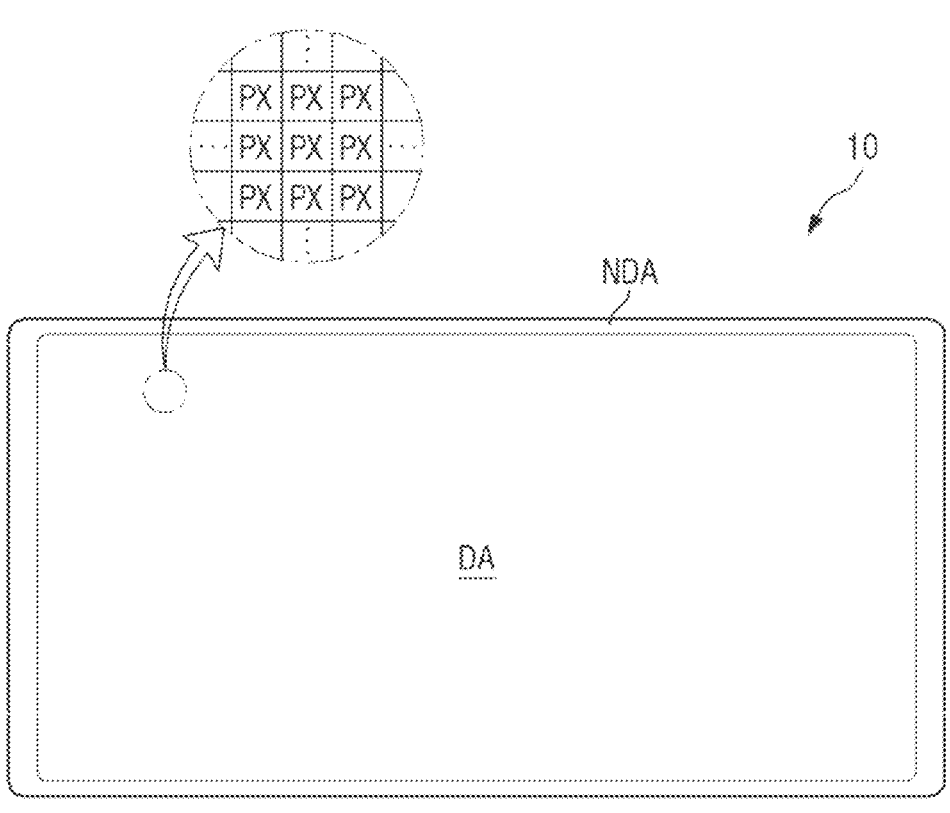
FIG. 1 is a perspective view showing a display device according to one or more embodiments.
Figure 1:
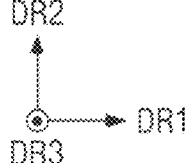

FIG. 1 is a perspective view showing a display device according to one or more embodiments.

Referring to FIG. 1, a display device 10 may display a moving image or a still image. The display device 10 may refer to any suitable electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be exemplified, but the present disclosure is not limited thereto, and other suitable display panels may be applied within the same technical spirit of the present disclosure.

Hereinafter, a first direction DR1, a second direction DR2, and a third direction DR3 are defined, as shown in the drawings of one or more embodiments describing the display device 10. The first direction DR1 and the second direction DR2 may be directions crossing (e.g., perpendicular or substantially perpendicular) to each other in one plane. The third direction DR3 may be a direction crossing (e.g., perpendicular or substantially perpendicular) to the plane on which the first direction DR1 and the second direction DR2 are located. For example, the third direction DR3 may be perpendicular or substantially perpendicular to each of the first direction DR1 and the second direction DR2. In the embodiment describing the display device 10, the third direction DR3 indicates a thickness direction of the display device 10.

The display device 10 may have a rectangular shape including long and short sides such that the sides in the first direction DR1 are longer than the sides in the second direction DR2 in a plan view. A corner portion where the long side and the short side of the display device 10 meet may be right-angled in a plan view. However, the present disclosure is not limited thereto, and the corner may be rounded to have a curved shape. The planar shape of the display device 10 is not limited to the illustrated example, and may be other suitable shapes such as a square shape, a quadrilateral shape with rounded corners (vertices), other polygonal shapes and/or a circular shape.

A display surface of the display device 10 may be positioned on one side of the display device 10 in the third direction DR3, which is the thickness direction. In embodiments describing the display device 10, unless otherwise noted, the term "upward" refers to one side of the third direction DR3, which is the display direction, and the term "top surface" refers to a surface toward (e.g., facing) the one side of the third direction DR3. Further, the term "downward" refers to the other side of the third direction DR3, which is an opposite direction to the display direction, and the term "bottom surface" refers to a surface toward (e.g., facing) the other side of the third direction DR3. Furthermore, "left", "right", "upper" and "lower" indicate directions when the display device 10 is viewed from above. For example, "right side" indicates one side of the first direction DR1, "left side" indicates the other side of the first direction DR1, "upper side" indicates one side of the second direction DR2, and "lower side" indicates the other side of the second direction DR2.

The display device 10 may include a display area DA and a non-display area NDA. The display area DA is an area where a screen (e.g., an image) can be displayed, and the non-display area NDA is an area where a screen (e.g., an image) is not displayed.

The shape of the display area DA may be similar to the overall shape of the display device 10. For example, the display area DA may have a rectangular shape in a plan view. The display area DA may substantially occupy the center of the display device 10.

The display area DA may include a plurality of pixels PX. The plurality of pixels PX may be arranged in a matrix. The shape of each pixel PX may be a rectangular and/or square shape in a plan view. However, the shape of each pixel PX is not limited thereto, and may be a rhombus shape in which each side is inclined with respect to one direction. The pixels PX may be arranged alternately with each other in a stripe formation or a PenTile®/PENTILE® formation (PEN-TILE® is a registered trademark owned by Samsung Display Co., Ltd.).

The non-display area NDA may be around the display area DA. The non-display area NDA may completely or partially surround the display area DA. In one or more embodiments, the display area DA may have a rectangular shape, and the non-display area NDA may be adjacent to four sides of the display area DA. The non-display area NDA may form a bezel of the display device 10. In the non-display area NDA, wires, circuit drivers, and/or pad portions on which an external device is mounted may be positioned in the display device 10.

Figure 2:
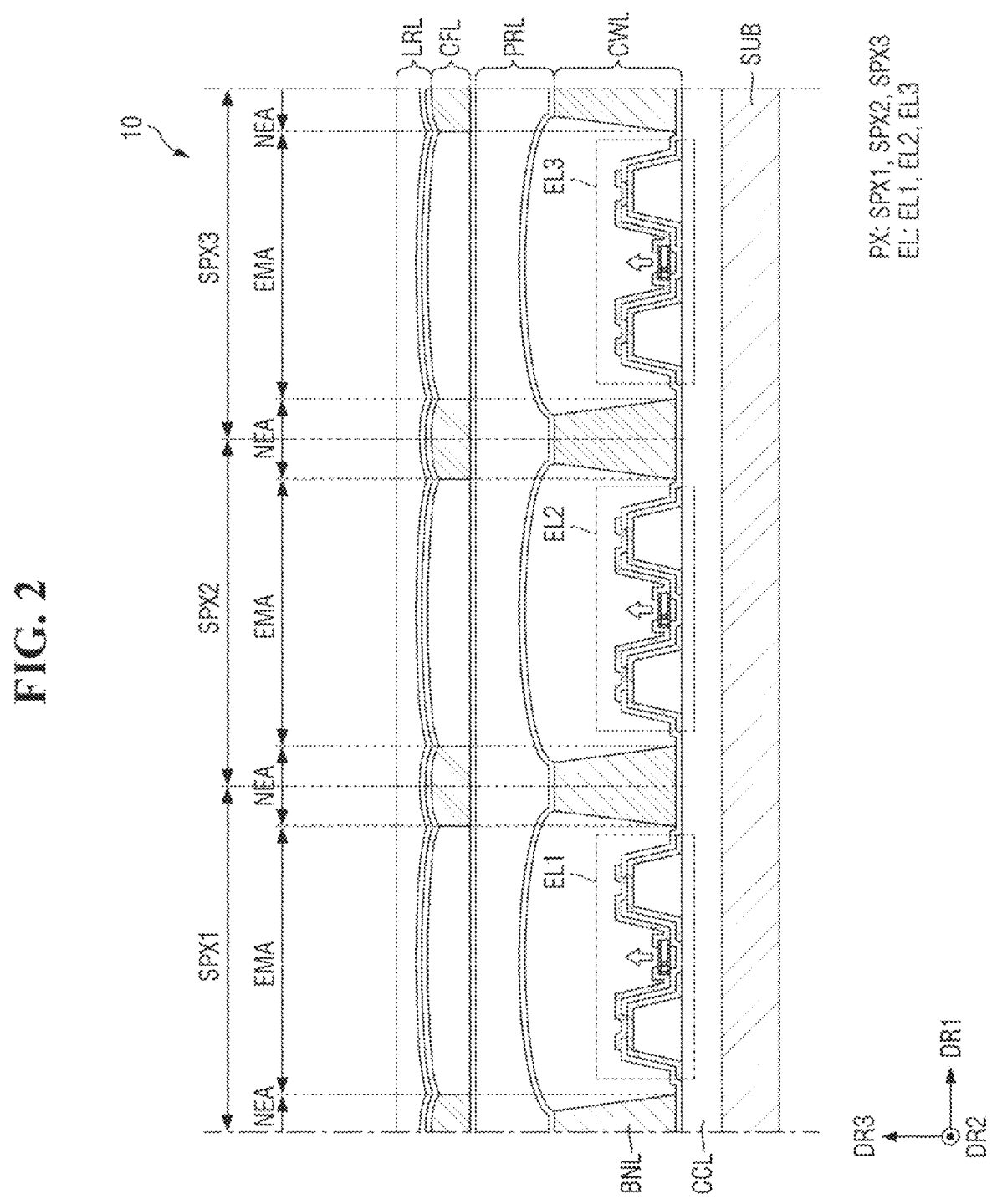

FIG. 2 is a schematic cross-sectional view of a display device according to one or more embodiments.

Referring to FIG. 2, each of the plurality of pixels PX may include a plurality of sub-pixels SPX1, SPX2, and SPX3. For example, one pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. The first color may be red, the second color may be green, and the third color may be blue. FIG. 2 illustrates that the pixel PX includes three sub-pixels SPX1, SPX2, and SPX3, but the present disclosure is not limited thereto, and the pixel PX may include a larger number of sub-pixels.

Each of the sub-pixels SPX1, SPX2, and SPX3 in the display device 10 may include an emission area EMA and a non-emission area NEA. The emission area EMA may be an area where a light emitting element layer EL is positioned to emit light in a set or specific wavelength band. The non-emission area NEA may be an area where the light emitting element layer EL is not positioned and which the above light does not reach, so that no light is emitted in the non-emission area NEA.

The display device 10 may include a substrate SUB and the light emitting element layer EL, a wavelength control layer CWL, a protective layer PRL, a color filter layer CFL, and an anti-reflection layer LRL on the substrate SUB. In one or more embodiments, the display device 10 may further include a circuit layer CCL between the substrate SUB and the light emitting element layer EL. The circuit layer CCL, the light emitting element layer EL, the wavelength control layer CWL, the protective layer PRL, the color filter layer CFL, and the anti-reflection layer LRL may be sequentially on the substrate SUB.

A bank BNL may be provided at a boundary between adjacent ones of the plurality of sub-pixels SPX1, SPX2, and SPX3, and the light emitting element layer EL may be in each of the sub-pixels SPX1, SPX2, and SPX3 divided by the bank BNL. The light emitting element layer EL may be between the wavelength control layer CWL and the circuit layer CCL that are on the substrate SUB, and may include a plurality of light emitting elements ED (see FIG. 3) to emit light in a set or specific wavelength band. The light may be incident on the color filter layer CFL through the wavelength control layer CWL.

The display device 10 according to one or more embodiments may be a top emission display device in which light L is emitted in an upward direction of the substrate SUB on which the light emitting element layer EL is positioned. The light emitted from the light emitting element layer EL may travel in a downward direction of the substrate SUB, but may be reflected by a structure in the light emitting layer EL or a structure of the circuit layer CCL to be emitted in an upward direction of the substrate SUB. The display device 10 may be a top emission display device including only one substrate with a plurality of layers sequentially positioned on the substrate SUB. However, the present disclosure is not limited thereto, and an additional substrate facing the substrate SUB may be further included.

Hereinafter, the display device 10 including the light emitting element layer EL, the wavelength control layer CWL, the protective layer PRL, the color filter layer CFL, and the anti-reflection layer LRL will be described in more detail with further reference to other drawings.

FIG. 3 is a schematic plan view illustrating a light emitting element layer in one pixel of a display device according to one or more embodiments. FIG. 4 is a cross-sectional view taken along the lines Q1-Q', Q2-Q2', and Q3-Q3' of FIG. 3. FIG. 5 is a cross-sectional view taken along the line Q4-Q4' of FIG. 3. FIG. 6 is a cross-sectional view illustrating an anti-reflection layer in a display device according to one or more embodiments. FIG. 7 is a cross-sectional view illustrating a coating layer of an anti-reflection layer according to one or more embodiments. FIG. 8 is a cross-sectional view illustrating a coating layer of an anti-reflection layer according to one or more other embodiments. FIG. 9 is a perspective view schematically illustrating a light emitting element in a display device according to one or more embodiments.

FIG. 3 shows the light emitting element layer EL. FIG. 4 shows a cross section across the first sub-pixel SPX1. FIG. 5 shows a cross section across the first to third sub-pixels SPX1, SPX2, and SPX3.

Referring to FIGS. 3 to 5 in conjunction with FIG. 2, the bank BNL is over the boundary between the sub-pixels SPX1, SPX2, and SPX3. The bank BNL may be to extend in the first direction DR1 and the second direction DR2 and may distinguish neighboring sub-pixels SPX1, SPX2, and SPX3 while surrounding the sub-pixels SPX1, SPX2, and SPX3.

Each sub-pixel SPX1, SPX2, SPX3 may include the non-emission area NEA in addition to the emission area EMA. In some embodiments, each sub-pixel SPX1, SPX2, SPX3 may include a sub-region SA provided in the non-emission area NEA. The sub-region SA may be on one side of the emission area EMA in a second direction DR2. The sub-region SA may be between the emission areas EMA of the sub-pixels adjacent to each other in the second direction DR2. The plurality of emission areas EMA and sub-regions SA may be arranged in the display area DA of the display device 10. For example, the emission areas EMA may be repeatedly arranged with each other in the first direction DR1 and the sub-regions SA may be repeatedly arranged with each other in the first direction DR1, and the emission areas EMA and the sub-regions SA may be alternately arranged with each other in the second direction DR2.

A bank BNL may be between the sub-regions SA and between the emission areas EMA, and the distance therebetween may vary depending on the widths of the bank BNL in the first direction DR1 and the second direction DR2. Light may not be emitted from the sub-region SA because the light emitting element ED is not positioned in the sub-region SA, but an electrode RME in each of the sub-pixels SPX1, SPX2, and SPX3 may be partially in the sub-region SA. The electrodes RME in the sub-pixels SPX1, SPX2, and SPX3 may be separated from each other in the sub-region SA.

The substrate SUB may be an insulating substrate. The substrate SUB may be made of a transparent insulating material such as glass, quartz, and/or polymer resin. Further, the substrate SUB may be a rigid substrate, but may also be a flexible substrate which can be bent, folded and/or rolled.

The circuit layer CCL may be on the substrate SUB. The circuit layer CCL may include a first conductive layer, a semiconductor layer, a second conductive layer, and a third conductive layer, and a plurality of insulating layers therebetween.

Although the drawings illustrate that only one first transistor TR1 and some wires are provided in the circuit layer CCL, the present disclosure is not limited thereto. The circuit layer CCL of the display device 10 may include a larger number of transistors, in addition to the first transistor TR1, by including more wires, electrodes, and/or semiconductor layers. The circuit layer CCL may also include a capacitor. For example, the display device 10 may include two, three, six or seven transistors by further including one or more transistors in addition to the first transistor TR1 for each of the sub-pixels SPX1, SPX2, and SPX3.

A first conductive layer CAS may be on the substrate SUB. The first conductive layer CAS may overlap an active layer ACT of a first transistor TR1 of the display device 10. The first conductive layer CAS may include a material that blocks or reduces light to prevent or reduce the light from reaching the active layer ACT of the first transistor. For example, the first conductive layer CAS may be formed of an opaque metal material that blocks or reduces transmission of light. However, the present disclosure is not limited thereto, and in some embodiments, the first conductive layer CAS may be omitted.

The buffer layer BL may be entirely on the first conductive layer CAS and the first substrate SUB. The buffer layer BL may be formed on the first substrate SUB to protect the first transistors TR1 of the sub-pixels SPX1, SPX2, and SPX3 from moisture permeating through the substrate SUB susceptible to moisture permeation, and may perform a surface planarization function. The buffer layer BL may be formed of a plurality of inorganic layers that are alternately stacked. For example, the buffer layer BL may be formed as a double layer formed by stacking, or a multilayer formed by alternately stacking, inorganic layers including at least one of silicon oxide (SiOx), silicon nitride (SiNx), and/or silicon oxynitride (SiOxNy). In one or more embodiments, each of the layers may be formed of one inorganic layer including the above materials.

The semiconductor layer is provided on the buffer layer BL. The semiconductor layer may include the active layer ACT of the first transistor TR1. This layer may partially overlap a gate electrode GE of a second conductive layer, which will be described in more detail herein below.

In one or more embodiments, the semiconductor layer may include polycrystalline silicon, monocrystalline silicon, oxide semiconductor, and/or the like. When the semiconductor layer includes the oxide semiconductor, each active layer ACT may include a plurality of conductive regions ACTa and ACTb and a channel region ACTc between them. The oxide semiconductor may be an oxide semiconductor containing indium (In). In some embodiments, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) and/or the like.

In one or more other embodiments, the semiconductor layer may include polycrystalline silicon. The polycrystalline silicon may be formed by crystallizing amorphous silicon. In this case, the conductive regions of the active layer ACT may be regions doped with impurities.

The gate insulating layer GI is provided on the semiconductor layer and the buffer layer BL. The gate insulating layer GI may function as a gate insulating layer of each transistor. The gate insulating layer GI may be formed as a double layer formed by stacking, or a multilayer formed by alternately stacking, inorganic layers including at least one of silicon oxide (SiOx), silicon nitride (SiNx), and/or silicon oxynitride (SiOxNy). In one or more embodiments, each of the layers may be formed of one inorganic layer including the above materials.

The second conductive layer is provided on the gate insulating layer GI. The second conductive layer may include the gate electrode GE of the first transistor TR1. The gate electrode GE may overlap the channel region ACTc of the active layer ACT in the thickness direction. The second conductive layer may be formed as a single layer or multiple layers made of any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

An interlayer insulating layer IL may be on the second conductive layer. The interlayer insulating layer IL may be arranged to cover the second conductive layer to protect the second conductive layer. The interlayer insulating layer IL may be formed as a double layer formed by stacking, or a multilayer formed by alternately stacking, inorganic layers including at least one of silicon oxide (SiOx), silicon nitride (SiNx), and/or silicon oxynitride (SiOxNy). In one or more embodiments, each of the layers may be formed of one inorganic layer including the above materials.

The third conductive layer is provided on the interlayer insulating layer IL. The third conductive layer may include a source electrode S1 and a drain electrode D1 of the first transistor TR1, a first voltage line VL1, a second voltage line VL2, and a conductive pattern CDP.

The source electrode S1 and the drain electrode D1 of the first transistor TR1 may be in contact with the conductive regions ACTa and ACTb of the active layer ACT, respectively, through a contact hole penetrating the interlayer insulating layer IL and the gate insulating layer GI. In addition, the source electrode S1 of the first transistor TR1 may be electrically connected (e.g., electrically coupled) to the first conductive layer CAS through another contact hole.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. A portion of the first voltage line VL1 may be in contact with the active layer ACT of the first transistor TR1 through the contact hole penetrating the interlayer insulating layer IL and the gate insulating layer GI. The first voltage line VL1 may serve as a drain electrode D1 of the first transistor TR1. The first voltage line VL1 may be electrically connected (e.g., electrically coupled) to the first electrode RME1 to be described in more detail herein below. The second voltage line VL2 may be directly connected (e.g., electrically and/or physically coupled) to the second electrode RME2 to be described in more detail herein below.

A conductive pattern CDP may be connected to the active layer ACT of the first transistor TR1 through the contact hole penetrating the interlayer insulating layer IL and the gate insulating layer GI. The conductive pattern CDP may serve as a source electrode S1 of the first transistor TR1.

The third conductive layer may be formed as a single layer or multiple layers made of any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

The via layer VIA is provided on the third conductive layer. The via layer VIA may include an organic insulating material, for example, an organic material such as polyimide (PI), to perform a surface planarization function.

The plurality of electrodes RME (RME1 and RME2), a plurality of bank patterns BP, the bank BNL, the plurality of light emitting elements ED, and a plurality of connection electrodes CNE1 and CNE2 may be provided, as the light emitting element layer EL, on the via layer VIA. Further, a plurality of insulating layers PAS1, PAS2, and PAS3 may be further provided on the via layer VIA.

The plurality of bank patterns BP may be directly on the via layer VIA. The plurality of bank patterns BP, which may have a shape extending in the second direction DR2 within each of the sub-pixels SPX1, SPX2, and SPX3 without extending to other sub-pixels SPX1, SPX2, and SPX3 adjacent in the second direction DR2, may be in the emission area EMA. In some embodiments, the plurality of bank patterns BP may be spaced apart from each other in the first direction DR1, and the light emitting element ED may be positioned therebetween. The plurality of bank patterns BP may be in each of the sub-pixels SPX1, SPX2, and SPX3 to form a linear pattern in the display area DA of the display device 10. In the drawings, two bank patterns BP are illustrated, but the present disclosure is not limited thereto. A larger number of bank patterns BP may be provided, depending on the number of the electrodes RME1 and RME2.

The bank pattern BP may have a structure in which at least a part thereof protrudes with respect to the top surface of the via layer VIA. The protruding portion of the bank pattern BP may have inclined side surfaces, and the light emitted from the light emitting element ED may be reflected by the electrodes RME positioned on the bank pattern BP and emitted in an upward direction from the via layer VIA. The bank pattern BP may provide a region in which the light emitting element ED is positioned, and may also function as a reflective partition wall that reflects light emitted from the light emitting element ED upward. The side surface of the bank pattern BP may be linear and inclined, but is not limited thereto, and the outer surface of the bank pattern BP may have a curved semi-circle or semi-ellipse shape. The bank pattern BP may include an organic insulating material such as polyimide (PI), but is not limited thereto.

The plurality of electrodes RME may be provided on the bank pattern BP and the via layer VIA. The plurality of electrodes RME may include the first electrode RME1 and the second electrode RME2. The first electrode RME1 and the second electrode RME2 may each extend in the second direction DR2 and may be spaced apart from each other in the first direction DR1.

The first electrode RME1 and the second electrode RME2 may each extend in the second direction DR2 in the sub-pixels SPX1, SPX2 and SPX3, but may be separated from other electrodes RME1 and RME2 in the sub-region SA. For example, the sub-region SA may be between the emission areas EMA of the sub-pixels adjacent to each other in a direction opposite to (or along) the second direction DR2, and the first electrode RME1 and the second electrode RME2 may be separated from other first and second electrodes RME1 and RME2 in a sub-pixel adjacent in the second direction DR2 in a separation portion ROP of the sub-region SA. However, the present disclosure is not limited thereto, and some electrodes RME1 and RME2 may extend beyond a sub-pixel adjacent in the second direction DR2 without being separated for each sub-pixel SPX1, SPX2, SPX3, or only one of the first electrode RME1 and the second electrode RME2 may be separated.

The first electrode RME1 may be electrically connected (e.g., electrically coupled) to the first transistor TR1 through a first electrode contact hole CT1, and the second electrode RME2 may be electrically connected (e.g., electrically coupled) to the second voltage line VL2 through a second electrode contact hole CT2. For example, the first electrode RME1 may be in contact with the conductive pattern CDP through the first electrode contact hole CT1 penetrating the via layer VIA in an area overlapping the bank BNL, for example, between the sub-region SA and the emission area EMA. The second electrode RME2 may also be in contact with the second voltage line VL2 through the second electrode contact hole CT2 penetrating the via layer VIA. However, the present disclosure is not limited thereto. In other embodiments, the first electrode contact hole CT1 and the second electrode contact hole CT2 may be in the sub-region SA.

The first electrode contact hole CT1 may connect the first electrode RME1 to the conductive pattern CDP. A signal for aligning the light emitting elements ED may be applied to the first voltage line VL1, and then applied to the first electrode RME1 through the first transistor TR1 and the conductive pattern CDP. The second electrode contact hole CT2 may connect the second electrode RME2 to the second voltage line VL2. The second power voltage may be applied to the second electrode RME2 through the second voltage line VL2. After the light emitting elements ED are aligned, the first electrode RME1 and the second electrode RME2 are separated in the separation portion ROP, and the second electrode RME2 does not receive a signal from the second voltage line VL2.

In the drawings, it is illustrated that one first electrode RME1 and one second electrode RME2 are in each sub-pixel SPX1, SPX2, SPX3, but the present disclosure is not limited thereto and the number of the first electrode RME1 and the second electrode RME2 in each sub-pixel SPX1, SPX2, SPX3 may be greater. In one or more embodiments, the first electrode RME1 and the second electrode RME2 in each sub-pixel SPX1, SPX2, SPX3 may not necessarily have a shape extending in one direction, and the first electrode RME1 and the second electrode RME2 may be provided in various suitable shapes and/or structures. For example, the first electrode RME1 and the second electrode RME2 may have a partially curved or bent shape, and one electrode may surround the other electrode.

The first electrode RME1 and the second electrode RME2 may be directly on the bank patterns BP, respectively. Each of the first electrode RME1 and the second electrode RME2 may be formed to have a larger width than that of the bank pattern BP. For example, each of the first electrode RME1 and the second electrode RME2 may cover the outer surface of the bank pattern BP. The first electrode RME1 and the second electrode RME2 may be on the side surfaces of the bank pattern BP, respectively, and a distance between the first electrode RME1 and the second electrode RME2 may be smaller than a distance between the bank patterns BP. Further, at least a portion of the first electrode RME1 and the second electrode RME2 may be directly arranged on the via layer VIA, so that the first electrode RME1 and the second electrode RME2 may be arranged on the same plane. However, the present disclosure is not limited thereto. In some embodiments, the width of the first electrode RME1 and the second electrode RME2 may be smaller than that of the bank pattern BP. However, each of the first electrode RME1 and second electrode RME2 may cover at least one side surface of the bank pattern BP to reflect light emitted from the light emitting element ED.

The first electrode RME1 and the second electrode RME2 may include a conductive material having a high reflectance. For example, the first electrode RME1 and the second electrode RME2 may include a metal such as silver (Ag), copper (Cu), and/or aluminum (Al) as a material having a high reflectance, or may be an alloy including aluminum (Al), nickel (Ni), lanthanum (La), and/or the like. The first electrode RME1 and the second electrode RME2 may reflect the light, emitted from the light emitting element ED and traveling to the side surface of the bank pattern BP, in an upward direction of each sub-pixel SPX1, SPX2, SPX3.

However, the present disclosure is not limited thereto, and the first electrode RME1 and the second electrode RME2 may further include a transparent conductive material. For example, the first electrode RME1 and the second electrode RME2 may include a material such as indium tin oxide (ITO), indium zinc oxide (IZO), and/or indium tin zinc oxide (ITZO). In some embodiments, the first electrode RME1 and the second electrode RME2 may have a structure in which at least one transparent conductive material and at least one metal layer having a high reflectance are stacked, or may be formed as one layer including these materials. For example, the first electrode RME1 and the second electrode RME2 may have a stacked structure of ITO/silver(Ag)/ITO, ITO/Ag/IZO, ITO/Ag/ITZO/IZO, or the like.

The first and second electrodes RME1 and RME2 may be used to form an electric field in the sub-pixel SPX1, SPX2, SPX3 to align the light emitting element ED. The light emitting element ED may be positioned between the first electrode RME1 and the second electrode RME2 by the electric field formed on the first electrode RME1 and the second electrode RME2. The light emitting elements ED of the display device 10 may be injected onto the electrodes RME through an inkjet printing process. When inks including the light emitting elements ED are injected onto the electrodes RME, an alignment signal is applied to the electrodes RME to generate an electric field. A set or predetermined voltage may be applied to the first electrode RME1 and the second electrode RME2 through the first voltage line VL1 and the second voltage line VL2 so that the light emitting elements ED are aligned. The light emitting elements ED dispersed in the inks may be aligned by receiving the dielectrophoretic force by the electric field generated on the electrodes RME1 and RME2.

The electrodes RME1, RME2 that are provided in different sub-pixels adjacent in the second direction DR2 may be spaced apart from each other in the separation portion ROP of the sub-region SA. The electrodes RME1 and RME2 may be formed by first forming each electrode as a single electrode line extending in the second direction DR2, then the light emitting elements ED are arranged, and then in a subsequent process, the electrode line is separated. The electrode line may be used to generate an electric field in the sub-pixels to align the light emitting elements ED during the manufacturing process of the display device 10. After aligning the light emitting elements ED, the electrode line may be separated at the separation portion ROP to form the plurality of electrodes RME1 and RME2 separated in the second direction DR2.

The first insulating layer PAS1 may be on the via layer VIA, the bank patterns BP, and the plurality of electrodes RME1 and RME2. The first insulating layer PAS1 may be on the via layer VIA to cover the plurality of electrodes RME1 and RME2 and the bank patterns BP. The first insulating layer PAS1 may also be in the sub-region SA, but may not be in the separation portion ROP in which the electrodes RME1 and RME2 are separated. The first insulating layer PAS1 may protect the plurality of electrodes RME1 and RME2 and insulate electrodes RME1 and RME2 different from each other. In addition, the first insulating layer PAS1 may prevent or reduce the damage to the light emitting element ED that may be caused by direct contact with other members.

In one or more embodiments, the first insulating layer PAS1 may have stepped portions such that the top surface thereof is partially depressed between the electrodes RME1 and RME2 spaced apart in the first direction DR1. The light emitting element ED may be on the top surface of the first insulating layer PAS1, where the stepped portions are formed, and thus a space may remain between the light emitting element ED and the first insulating layer PAS1.

The bank BNL may be on the first insulating layer PAS1. The bank BNL may include portions extending in the first direction DR1 and the second direction DR2 in a plan view, and in some embodiments, may be arranged in a grid pattern. The bank BNL may be positioned along the boundaries between the sub-pixels SPX1, SPX2, and SPX3 to delimit the neighboring sub-pixels SPX1, SPX2, and SPX3. In one or more embodiments, the bank BNL may surround the emission area EMA and the sub-region SA, and areas partitioned and opened by the bank BNL may be the emission area EMA and the sub-region SA, respectively.

The bank BNL may have a set or certain height, and in some embodiments, the height of the top surface of the bank BNL (e.g., in the third direction DR3) may be higher than that of the bank pattern BP, and the thickness of the bank BNL (e.g., in the first direction DR1) may be equal to or greater than that of the bank pattern BP. However, the present disclosure is not limited thereto, and the height of the top surface of the bank BNL may be same as or lower than that of the bank pattern BP, and the thickness of the bank BNL may be smaller than that of the bank pattern BP. The bank BNL may prevent or reduce the overflow of ink to the adjacent sub-pixel SPX1, SPX2, SPX3 in an inkjet printing step during the manufacturing process of the display device 10. The bank BNL may prevent or reduce the mixing of the inks where different light emitting elements ED are dispersed in the different sub-pixels SPX1, SPX2, and SPX3. Similarly to the bank pattern BP, the bank BNL may include polyimide, but is not limited thereto.

The plurality of light emitting elements ED may be arranged on the first insulating layer PAS1. The light emitting element ED may include a plurality of layers arranged in a direction parallel (e.g., substantially parallel) to the top surface of the substrate SUB. The light emitting element ED of the display device 10 may be positioned such that one extension direction thereof is parallel to the substrate SUB, and the plurality of semiconductor layers included in the light emitting element ED may be sequentially arranged in a direction parallel (e.g., substantially parallel) to the top surface of the substrate SUB. However, the present disclosure is not limited thereto. In some embodiments, when the light emitting element ED has a different structure, the plurality of layers may be arranged in the third direction DR3 perpendicular (e.g., substantially perpendicular) to the substrate SUB.

The plurality of light emitting elements ED may be spaced apart from each other along the second direction DR2 in which the electrodes RME1 and RME2 extend, and may be aligned substantially parallel to each other. The light emitting element ED may have a shape extending in one direction, and the extension direction of the light emitting element ED may be substantially perpendicular to the extension direction of the electrodes RME1 and RME2. However, the present disclosure is not limited thereto, and the light emitting elements ED may each be arranged to extend in a direction oblique, rather than perpendicular, to the extending direction of the electrodes RME1 and RME2.

The light emitting elements ED in the sub-pixels SPX1, SPX2, and SPX3 may include a light emitting layer to emit light of the same wavelength band to the outside. Accordingly, light of the same color may be emitted from the first sub-pixel SPX1, the second sub-pixel SPX2, and the third sub-pixel SPX3. However, the present disclosure is not limited thereto, and each of the sub-pixels SPX1, SPX2, and SPX3 may include a different light emitting element ED to emit light of a different color.

Between the bank patterns BP, the light emitting element ED may have both ends respectively above the electrodes RME1 and RME2. The extension length of the light emitting element ED is greater than a distance between the first electrode RME1 and the second electrode RME2, and both ends of the light emitting element ED may be above the first electrode RME1 and the second electrode RME2, respectively. For example, the light emitting element ED may be positioned such that one end is placed above the first electrode RME1 and the other end is placed above the second electrode RME2.

The both ends of the light emitting element ED may be in contact with the connection electrodes CNE1 and CNE2, respectively. For example, in the light emitting element ED, an insulating layer 38 (see FIG. 9) may not be formed on an end surface of the light emitting element ED in one direction in which the light emitting element ED extends, and thus a portion of a semiconductor layer 31, 32 (see FIG. 9), or a portion of an electrode layer 37 (see FIG. 9), may be exposed, and the exposed semiconductor layer or electrode layer may be in contact with the connection electrodes CNE1 and CNE2. However, the present disclosure is not limited thereto, and at least a portion of the insulating layer may be removed from the light emitting element ED to partially expose the side surfaces at both ends of the semiconductor layer. The side surfaces of the exposed semiconductor layer may be in direct contact with the connection electrodes CNE1 and CNE2.

The second insulating layer PAS2 may be partially on the light emitting element ED. For example, the second insulating layer PAS2 may have a width smaller than the extension length of the light emitting element ED and may be on the light emitting element ED to expose both ends of the light emitting element ED while surrounding the light emitting element ED. During the manufacturing process of the display device 10, the second insulating layer PAS2 may be provided to cover the light emitting element ED, the electrodes RME1 and RME2, and the first insulating layer PAS1 and then may be patterned to expose both ends of the light emitting element ED. The second insulating layer PAS2 may extend in the second direction DR2 on the first insulating layer PAS1 and the light emitting element ED in a plan view, thereby forming a linear or island-like pattern in each of the sub-pixels SPX1, SPX2, and SPX3. The second insulating layer PAS2 may protect the light emitting element ED while affixing the light emitting element ED during the fabricating process of the display device 10.

The plurality of connection electrodes CNE1 and CNE2 may be on the first insulating layer PAS1, the second insulating layer PAS2, and the light emitting element ED.

The plurality of connection electrodes CNE1 and CNE2 may be on the electrodes RME1 and RME2, respectively. The connection electrodes CNE1 and CNE2 may include a first connection electrode CNE1 on the first electrode RME1 and a second connection electrode CNE2 on the second electrode RME2. The connection electrodes CNE1 and CNE2 may be spaced apart and facing each other. For example, the first connection electrode CNE1 and the second connection electrode CNE2 may be on the first electrode RME1 and the second electrode RME2, respectively, so as to be spaced apart from each other in the first direction DR1.

The first connection electrode CNE1 may extend in the second direction DR2 within the emission area EMA. The first connection electrode CNE1 may overlap the first electrode RME1 and may be parallel (e.g., substantially parallel) to the first electrode RME1. The first connection electrode CNE1 may have a shape substantially extending in the second direction DR2.

The second connection electrode CNE2 may extend in the second direction DR2 within the emission area EMA. The second connection electrode CNE2 may overlap the second electrode RME2 and may be parallel (e.g., substantially parallel) to the second electrode RME2. The second connection electrode CNE2 may have a shape substantially extending in the second direction DR2.

The plurality of connection electrodes CNE1 and CNE2 may each be in contact with the light emitting element ED. The first connection electrode CNE1 may be in contact with one (e.g., first) end of the light emitting element ED, and the second connection electrode CNE2 may be in contact with the other (e.g., second) end of the light emitting element ED. The semiconductor layer or the electrode layer may be exposed on both end surfaces of the light emitting element ED in an extension direction thereof, and each of the connection electrodes CNE1 and CNE2 may be in contact with the semiconductor layer or the electrode layer of the light emitting element ED to be electrically connected (e.g., electrically coupled) thereto. One side of each of the connection electrodes CNE1 and CNE2 that is in contact with the respective end of the light emitting element ED may be on the side surface of the second insulating layer PAS2. In one or more embodiments, the first connection electrode CNE1 may be on one side surface of the second insulating layer PAS2, and the second connection electrode CNE2 may be on the other side surface of the second insulating layer PAS2.

Each of the connection electrodes CNE1 and CNE2 may have a width measured in one direction less than a width measured in the one direction of each of the electrodes RME1 and RME2. The connection electrodes CNE1 and CNE2 may not only contact one (e.g., first) end and the other (e.g., second) end of the light emitting element ED, respectively, but also may cover a portion of the top surface of the first electrode RME1 and a portion of the top surface of the second electrode RME2, respectively. However, the present disclosure is not limited thereto, and the connection electrodes CNE1 and CNE2 may have a width greater than the width of the electrodes RME1 and RME2 and may cover both sides of the electrodes RME1 and RME2.

The connection electrodes CNE1 and CNE2 may include a transparent conductive material. For example, they may include ITO, IZO, ITZO, aluminum (Al), and/or the like. The light emitted from the light emitting element ED may pass through the connection electrodes CNE1 and CNE2 and travel upward. However, the present disclosure is not limited thereto.

In the drawings, two connection electrodes CNE1 and CNE2 are provided in each of the sub-pixels SPX1, SPX2, SPX3, but the present disclosure is not limited thereto. The number of the connection electrodes CNE1 and CNE2 may vary depending on the number of the electrodes RME1 and RME2 for each of the sub-pixels SPX1, SPX2, and SPX3.

The third insulating layer PAS3 may be on the first connection electrode CNE1. The third insulating layer PAS3 may electrically insulate the first connection electrode CNE1 and the second connection electrode CNE2 from each other. The third insulating layer PAS3 may cover the first connection electrode CNE1, but may not be on the other end of the light emitting element ED so that the light emitting element ED may be in contact with the second connection electrode CNE2. The third insulating layer PAS3 may be partially in contact with the first connection electrode CNE1 and the second insulating layer PAS2 on the top surface of the second insulating layer PAS2. The side surface of the third insulating layer PAS3 toward (e.g., facing) the second electrode RME2 may be aligned with one side surface of the second insulating layer PAS2. In one or more embodiments, the third insulating layer PAS3 may be also in the non-emission area, e.g., on the first insulating layer PAS1 on the via layer VIA. However, the present disclosure is not limited thereto.

The second connection electrode CNE2 is on the second electrode RME2, the second insulating layer PAS2, and the third insulating layer PAS3. The second connection electrode CNE2 may be in contact with the other (e.g., second) end of the light emitting element ED and an exposed top surface of the second electrode RME2. The other (e.g., second) end of the light emitting element ED may be electrically connected (e.g., electrically coupled) to the second electrode RME2 through the second connection electrode CNE2.

The second connection electrode CNE2 may be partially in contact with the second insulating layer PAS2, the third insulating layer PAS3, the second electrode RME2, and the light emitting element ED. The first connection electrode CNE1 and the second connection electrode CNE2 may not be in contact with each other due to the second insulating layer PAS2 and the third insulating layer PAS3. However, the present disclosure is not limited thereto, and in some embodiments, the third insulating layer PAS3 may be omitted.

Each of the first insulating layer PAS1, the second insulating layer PAS2 and the third insulating layer PAS3 described above may include an inorganic insulating material or an organic insulating material. In one or more embodiments, the first insulating layer PAS1, the second insulating layer PAS2 and the third insulating layer PAS3 may include an inorganic insulating material such as silicon oxide (SiOx), silicon nitride (SiNx), silicon oxynitride (SiOxNy), aluminum oxide (AlOy), aluminum nitride (AlNx), and/or the like. In one or more embodiments, they may include an organic insulating material such as acrylic resin, epoxy resin, phenolic resin, polyamide resin, polyimide resin, unsaturated polyester resin, polyphenylene resin, polyphenylenesulfide resin, benzocyclobutene, cardo resin, siloxane resin, silsesquioxane resin, polymethylmethacrylate, polycarbonate, polymethylmethacrylate-polycarbonate synthetic resin, and/or the like. However, the present disclosure is not limited thereto.

The wavelength control layer CWL may be on the light emitting element layer EL. According to one or more embodiments, the wavelength control layer CWL may be in an area surrounded by the bank BNL. The wavelength control layer CWL may be provided for each sub-pixel SPX1, SPX2, SPX3, and in the area surrounded by the bank BNL, may be in the emission area EMA and may not be in the sub-region SA. The wavelength control layer CWL may be in a region of the light emitting element layer EL in which the light emitting element ED is positioned in the area surrounded by the bank BNL.

In some embodiments, the height of the wavelength control layer CWL may be greater than the height of the bank BNL. The wavelength control layer CWL may be formed through an inkjet printing process or a photo process during the manufacturing process of the display device 10. The wavelength control layer CWL may be formed through drying or exposure and development processes after a material constituting the wavelength control layer CWL is sprayed or applied into the area surrounded by the bank BNL. As one example, the material constituting the wavelength control layer CWL may include an organic material and have viscosity, and even if the organic material is sprayed or applied to a position higher than the bank BNL, it may not overflow to another sub-pixel SPX1, SPX2, SPX3 beyond the bank BNL. Accordingly, the height of the wavelength control layer CWL may be greater than that of the bank BNL. However, the present disclosure is not limited thereto.

In one or more embodiments in which the light emitting element layer EL of each sub-pixel SPX1, SPX2, SPX3 emits (e.g., is configured to emit) light of the third color, the wavelength control layer CWL may include a first wavelength conversion layer WCL1 in the first sub-pixel SPX1, a second wavelength conversion layer WCL2 in the second sub-pixel SPX2, and a light transmitting layer TPL in the third sub-pixel SPX3.

The first wavelength conversion layer WCL1 may include a first base resin BRS1 and a first wavelength conversion material WCP1 provided in the first base resin BRS1. The second wavelength conversion layer WCL2 may include a second base resin BRS2 and a second wavelength conversion material WCP2 provided in the second base resin BRS2. The first wavelength conversion layer WCL1 and the second wavelength conversion layer WCL2 may transmit the light of the third color incident from the light emitting element layer EL while converting the wavelength thereof. Scatterers SCP (e.g., light scatterers SCP) of the first wavelength conversion layer WCL1 and the second wavelength conversion layer WCL2 may increase wavelength conversion efficiency.

The light transmitting layer TPL may include a third base resin BRS3 and the scatterer SCP contained in the third base resin BSR3. The light transmitting layer TPL transmits the light of the third color incident from the light emitting element layer EL while maintaining its wavelength. The scatterers SCP of the light transmitting layer TPL may serve to control an emission path of the light emitted through the light transmitting layer TPL. The light transmitting layer TPL may not include a wavelength conversion material.

The scatterers SCP may have a refractive index different from those of the first to third base resins BRS1, BRS2, and BRS3. The scatterers SCP may be metal oxide particles or organic particles. Titanium oxide ($TiO_2$), zirconium oxide ($ZrO_2$), aluminum oxide ($Al_2O_3$), indium oxide ($In_2O_3$), zinc oxide ($ZnO_2$), silica, sulfuric acid Barium ($BaSO_4$), tin oxide ($SnO_2$), and the like may be exemplified as the metal oxide particles, and polystyrene, polymethyl methacrylate (PMMA), and the like may be exemplified as the organic particles. The scatterer SCP may have a hollow structure, but is not limited thereto.

The size of the scatterer SCP may be related to the wavelength of light emitted from the light emitting element ED. For example, when the wavelength of the light emitted from the light emitting element ED is $\lambda$, the size of the scatterer SCP may range from $\lambda/10$ to $5\lambda$, and may have a size of $\lambda/2$, but is not limited thereto. For example, when the light emitted from the light emitting element ED has a peak wavelength in a range of 480 nm or less, for example, in a range of 445 nm to 480 nm, the size of the scatterer SCP may be in a range from 150 nm to 300 nm.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, and/or the like. The first to third base resins BRS1, BRS2 and BRS3 may be formed of the same material, but the present disclosure is not limited thereto.

The first wavelength conversion material WCP1 may convert the light of the third color into the light of the first color, and the second wavelength conversion material WCP2 may convert the light of the third color into the light of the second color. The first wavelength conversion material WCP1 and the second wavelength conversion material WCP2 may be quantum dots, quantum bars, phosphors and/or the like.

For example, the first wavelength conversion material WCP1 may be a material that converts blue light into red light. The second wavelength conversion material WCP2 may be a material that converts blue light into green light. The first wavelength conversion material WCP1 and the second wavelength conversion material WCP2 may be a quantum dot (QD), a quantum bar, a fluorescent material, and/or a phosphorescent material. Examples of the quantum dot may include group IV nanocrystal, group II-VI compound nanocrystal, group III-V compound nanocrystal, group IV-VI nanocrystal, and a combination thereof.

The quantum dot may include a core and a shell surrounding the core. The core may be at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si and/or Ge, but is not limited thereto. The shell may include at least one of, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and/or PbTe, but is not limited thereto.

The fluorescent material may be an inorganic fluorescent material, and an inorganic phosphor such as garnets, silicates, sulfides, oxynitrides, nitrides, and/or aluminates may be used. The inorganic phosphor may include, for example, at least one of $Y_3Al_5O_{12}:Ce^{3+}$ (YAG:Ce), $Tb_3Al_5O_{12}:Ce^{3+}$ (TAG:Ce), $(Sr,Ba,Ca)_2SiO_4:Eu^{2+}$, $(Sr,Ba,Ca,Mg,Zn)_2Si(OD)_4:Eu^{2+}$ D=F,Cl,S,N,Br, $Ba_2MgSi_2O_7:Eu^{2+}$, $Ba_2SiO_4:Eu^{2+}$, $Ca_3(Sc,Mg)_2Si3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, $SiAlON:Ce^{3+}$, $\beta$-SiAlON:$Eu^{2+}$, Ca-$\alpha$-SiAlON:$Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, and/or $BaMg_2Al_{16}O_{27}:Eu^{2+}$, but is not limited thereto. However, the present disclosure is not limited thereto, and the fluorescent material may include an organic fluorescent material.

The wavelength control layer CWL may be directly on the light emitting element layer EL. In the display device 10, because the bank BNL has a set or predetermined height and may surround the sub-pixels SPX1, SPX2, and SPX3, the base resins BRS1, BRS2, and BRS3 of the wavelength control layer CWL may be directly on the third insulating layer PAS3 and the second connection electrode CNE2 of the light emitting element layer EL.

The base resins BRS1, BRS2, and BRS3 of the wavelength control layer CWL may surround the light emitting element ED, the bank pattern BP, the electrodes RME, and the connection electrodes CNE1 and CNE2 of the light emitting element layer EL in the area surrounded by the bank BNL. The scatterers SCP and the wavelength conversion materials WCP1 and WCP2 of the wavelength control layer CWL may be in the base resins BRS1, BRS2, and BRS3, and may be positioned around the light emitting element layer EL.

Light emitted from each light emitting element layer EL may be light of the same third color. Light emitted from the light emitting element layer EL may travel toward the wavelength control layer CWL. The third color light emitted from the light emitting element ED in the first sub-pixel SPX1 may be incident on the first wavelength conversion layer WCL1, the third color light emitted from the light emitting element ED in the second sub-pixel SPX2 may be incident on the second wavelength conversion layer WCL2, and the third color light emitted from the light emitting element ED in the third sub-pixel SPX3 may be incident on the light transmitting layer TPL. The third color light incident on the first wavelength conversion layer WCL1 may be converted into the first color light, and the third color light incident on the second wavelength conversion layer WCL2 may be converted into the second color light. Light incident on the light transmitting layer TPL may be transmitted as the same third color light without wavelength conversion. Although each sub-pixel SPX1, SPX2, SPX3 includes the light emitting element layer EL that emits light of the same color, it may display light of a different color depending on the arrangement of the wavelength control layer CWL on the light emitting element layer EL.

In one or more embodiments, the protective layer PRL may be on the wavelength control layer CWL. The protective layer PRL may protect an underlying structure including the wavelength control layer CWL and may planarize stepped portions. The protective layer PRL may include a first capping layer CPL1, an overcoat layer OC, and a second capping layer CPL2.

The first capping layer CPL1 may be on the wavelength control layer CWL. The first capping layer CPL1 may be on the bank BNL and the wavelength control layer CWL, to cover the bank BNL and the wavelength control layer CWL. The first capping layer CPL1 may be entirely in the display area DA (see FIG. 1) of the display device 10.

The first capping layer CPL1 may contain an inorganic material. For example, the first capping layer CPL1 may contain at least one of silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride.

Although the drawings show that the first capping layer CPL1 is formed as one layer, the present disclosure is not limited thereto. For example, the first capping layer CPL1 may be formed as a multilayer in which inorganic layers including at least any one of those exemplified as materials that may be contained in the first capping layer CPL1 are alternately stacked. The thickness of the first capping layer CPL1 may range from 0.05 μm to 2 μm, but is not limited thereto.

The overcoat layer OC may be on the first capping layer CPL1. The overcoat layer OC may be interposed between the first capping layer CPL1 and the second capping layer CPL2. The overcoat layer OC may be entirely in the display area DA (see FIG. 1) of the display device 10. The overcoat layer OC may be interposed between the wavelength control layer CWL and the color filter layer CFL to planarize the stepped portions formed by the wavelength control layer CWL. In addition, the overcoat layer OC may be a low refractive index layer that reduces the reflectance of light.

The overcoat layer OC may include an organic material. For example, the overcoat layer OC may include at least one of acrylic resin, epoxy resin, phenolic resin, polyamide resin, and/or polyimide resin. The thickness of the overcoat layer OC may range from 0.2 μm to 10 μm, but is not limited thereto.

The second capping layer CPL2 may be on the overcoat layer OC. The second capping layer CPL2 may be interposed between the overcoat layer OC and the color filter layer CFL. The overcoat layer OC may be entirely in the display area DA (see FIG. 1) of the display device 10. The second capping layer CPL2 may have substantially the same configuration as the above-described first capping layer CPL1, and thus a redundant description thereof will not be provided.

In one or more embodiments, the color filter layer CFL may be on the protective layer PRL in the display area DA (see FIG. 1). For example, the color filter layer CFL may be on the second capping layer CPL2 of the protective layer PRL. The color filter layer CFL may include a first light blocking member BK1 and a plurality of color filters CF in spaces partitioned by the first light blocking member BK1.

The first light blocking member BK1 may be on the second capping layer CPL2. The first light blocking member BK1 may be on the second capping layer CPL2 in the non-emission area NEA along the boundaries between the first to third sub-pixels SPX1, SPX2, and SPX3. The first light blocking member BK1 may overlap the bank BNL in the thickness direction (e.g., the third direction DR3) of the display device 10.

The first light blocking member BK1 may serve to not only block or reduce light emission, but also suppress or reduce the reflection of external light. The first light blocking member BK1 may be formed in a grid shape that surrounds the emission area EMA in a plan view. The first light blocking member BK1 may not be in the emission area EMA, but may be in the sub-region SA in each sub-pixel SPX1, SPX2, SPX3. For example, the first light blocking member BK1 may surround the emission area EMA. In some embodiments, the first light blocking member BK1 may be formed to have a width smaller than that of the bank BNL. However, the present disclosure is not limited thereto, and the first light blocking member BK1 may be formed to have substantially the same width as the bank BNL.

The first light blocking member BK1 may include an organic material. In one or more embodiments, the first light blocking member BK1 may include a light absorbing material that absorbs a visible wavelength band. As the first light blocking member BK1 includes a light absorbing material and is positioned along the boundaries between the first to third sub-pixels SPX1, SPX2, and SPX3, the first light blocking member BK1 may define the emission area EMA.

The color filter CF may include a first color filter CF1, a second color filter CF2, and a third color filter CF3.

The first color filter CF1 may be in the emission area EMA of the first sub-pixel SPX1, the second color filter CF2 may be in the emission area EMA of the second sub-pixel SPX2, and the third color filter CF3 may be in the emission area EMA of the third sub-pixel SPX3. The first to third color filters CF1, CF2, and CF3 may be surrounded by the first light blocking member BK1.

The first to third color filters CF1, CF2, and CF3 may include a colorant such as a dye or pigment that absorbs a wavelength other than a corresponding color wavelength. The first color filter CF1 may selectively allow the first color light (e.g., red light) to pass therethrough, and block, absorb, or reduce the second color light (e.g., green light) and the third color light (e.g., blue light). The second color filter CF2 may selectively allow the second color light (e.g., green light) to pass therethrough, and block, absorb, or reduce the first color light (e.g., red light) and the third color light (e.g., blue light). The third color filter CF3 may selectively allow the third color light (e.g., blue light) to pass therethrough, and block, absorb, or reduce the first color light (e.g., red light) and the second color light (e.g., green light). For example, the first color filter CF1 may be a red color filter, the second color filter CF2 may be a green color filter, and the third color filter CF3 may be a blue color filter.

In one or more embodiments, light incident on the first color filter CF1 may be light converted into the first color light by the first wavelength conversion layer WCL1, light incident on the second color filter CF2 may be light converted into the second color light by the second wavelength conversion layer WCL2, and light incident on the third color filter CF3 may be the third color light that has passed through the light transmitting layer TPL. As a result, the first color light passing through the first color filter CF1, the second color light passing through the second color filter CF2, and the third color light passing through the third color filter CF3 may be emitted in the upward direction of the substrate SUB to realize a full color spectrum.

The first to third color filters CF1, CF2, and CF3 may absorb a portion of the light coming from the outside of the display device 10 to reduce the reflected light of the external light. Thus, the first to third color filters CF1, CF2, and CF3 can prevent or reduce color distortion caused by the reflection of the external light.

In some embodiments, the area of an opening of the first light blocking member BK1 may be different for each sub-pixel SPX1, SPX2, SPX3. Depending on a color material included in the color filter layer CFL, the opening of the first light blocking member BK1 may have a different area for each sub-pixel SPX1, SPX2, SPX3, and the bank BNL may also be positioned correspondingly, so that the areas of the sub-pixels SPX1, SPX2, SPX3 may be different from each other. For example, the first color filter CF1 including a red color material may be in the first sub-pixel SPX1, and the area of the first sub-pixel SPX1 may be greater than the areas of the second sub-pixel SPX2 and the third sub-pixel SPX3. The second color filter CF2 including a green color material may be in the second sub-pixel SPX2, and the area of the second sub-pixel SPX2 may be greater than that of the third sub-pixel SPX3. However, the present disclosure is not limited thereto. At least one of the plurality of sub-pixels SPX1, SPX2, and SPX3 may have a different area from the other sub-pixels SPX1, SPX2, and SPX3, and the size relationship thereof may be different from the above-described case. In the display device 10, the area of each sub-pixel SPX1, SPX2, SPX3 may be differently designed to prevent or reduce display quality degradation caused by external light reflection of the display device 10.

The color filter layer CFL may be in the emission area EMA in each sub-pixel SPX1, SPX2, SPX3. In one or more embodiments, the color filter layer CFL is provided for each sub-pixel SPX1, SPX2, SPX3 to form an island-like pattern, but the present disclosure is not limited thereto. The color filter layer CFL may form a linear pattern in the entire display area DA.

Referring further to FIGS. 6 and 7, the anti-reflection layer LRL may be on the color filter layer CFL. The anti-reflection layer LRL may be entirely in the display area DA (see FIG. 1) of the display device 10. However, the present disclosure is not limited thereto, and the anti-reflection layer LRL may extend to the non-display area NDA (see FIG. 1) of the display device 10.

The anti-reflection layer LRL may include a first inorganic layer INL1, a second inorganic layer INL2, and a coating layer HCL.

The first inorganic layer INL1 may be on the color filter layer CFL. For example, the first inorganic layer INL1 may be on the first light blocking member BK1 and the color filter CF to be in contact with the first light blocking member BK1 and the color filter CF. The first inorganic layer INL1 may be entirely in the emission area EMA and the non-emission area NEA of each sub-pixel SPX1, SPX2, SPX3.

The first inorganic layer INL1 may have a set or predetermined refractive index to lower or reduce the external light reflectance of the anti-reflection layer LRL. The first inorganic layer INL1 may have a refractive index in a relatively intermediate range compared to the second inorganic layer INL2 and the coating layer HCL constituting the anti-reflection layer LRL. In one or more embodiments, the refractive index of the first inorganic layer INL1 may be substantially smaller than, or may be the same as, the refractive index of the second inorganic layer INL2. The refractive index of the first inorganic layer INL1 may be substantially greater than, or may be the same as, the refractive index of the coating layer HCL. The refractive index of the first inorganic layer INL1 may be in the range of 1.4 to 1.6.

The first inorganic layer INL1 may include an inorganic material. For example, the first inorganic layer INL1 may be made of silicon nitroxide (SiON) and/or silicon oxide (SiOx). However, the present disclosure is not limited thereto, and another suitable inorganic material may be applicable as long as it has excellent (or suitable) light transmittance and exhibits the above-described refractive index range.

The second inorganic layer INL2 may be on the first inorganic layer INL1. For example, the second inorganic layer INL2 may be interposed between the first inorganic layer INL1 and the coating layer HCL. Similar to the first inorganic layer INL1, the second inorganic layer INL2 may be entirely in the emission area EMA and the non-emission area NEA of each sub-pixel SPX1, SPX2, SPX3.

The second inorganic layer INL2 may have a set or predetermined refractive index to lower the external light reflectance of the anti-reflection layer LRL. The second inorganic layer INL2 may have a refractive index in a relatively high range compared to the first inorganic layer INL1 and the coating layer HCL constituting the anti-reflection layer LRL. The refractive index of the second inorganic layer INL2 may be substantially greater than, or may be the same as, the refractive index of the first inorganic layer INL1. The refractive index of the second inorganic layer INL2 may be greater than that of the coating layer HCL. In one or more embodiments, the refractive index of the second inorganic layer INL2 may be in a range of 1.6 to 2.2.

The second inorganic layer INL2 may include an inorganic material. For example, the second inorganic layer INL2 may be made of silicon nitride ($SiN_x$) and/or silicon nitroxide (SiON). However, the present disclosure is not limited thereto, and another suitable inorganic material may be applicable as long as it has excellent (or suitable) light transmittance and exhibits the above-described refractive index range.

The coating layer HCL may be on the second inorganic layer INL2. For example, the coating layer HCL may be in contact with the top surface of the second inorganic layer INL2, on the second inorganic layer INL2. Similar to the first inorganic layer INL1 and the second inorganic layer INL2, the coating layer HCL may be entirely in the emission area EMA and the non-emission area NEA of each sub-pixel SPX1, SPX2, SPX3.

The coating layer HCL may have a set or predetermined refractive index to lower the external light reflectance of the anti-reflection layer LRL. The coating layer HCL may have a refractive index in a relatively low range compared to the first inorganic layer INL1 and the second inorganic layer INL2 constituting the anti-reflection layer LRL. The refractive index of the coating layer HCL may be substantially smaller than, or may be the same as, the refractive index of the first inorganic layer INL1. The refractive index of the coating layer HCL may be smaller than that of the second inorganic layer INL2. In one or more embodiments, the refractive index of the coating layer HCL may be in the range of 1.2 to 1.5.

The coating layer HCL may include a base material BAS and hollow particles FIL included in the base material BAS.

The base material BAS may include a material exhibiting high hardness characteristics of the coating layer HCL. In one or more embodiments, the base material BAS may include a polyhedral oligomeric silsesquioxane (POSS)-based organic-inorganic composite material. For example, the base material BAS may include at least one of Chemical Formulae A, B, or C below:

Chemical Formula A

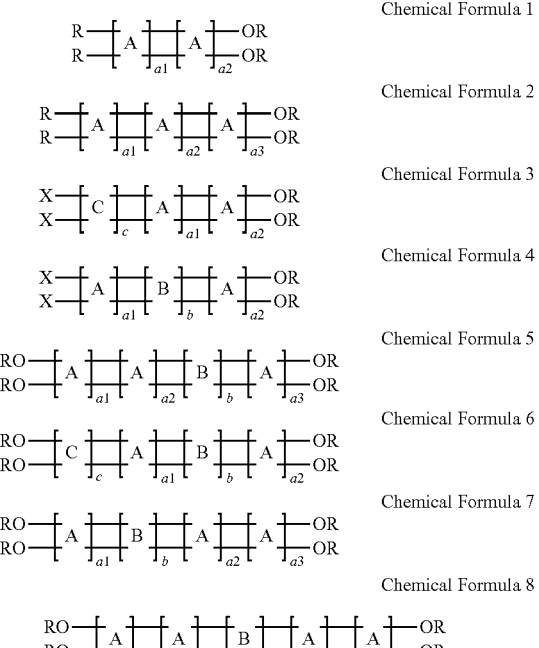

26

-continued

Chemical Formula B

Chemical Formula C

In Chemical Formulae A, B or C, each X is independently R or $[(SiO_{3/2}R)_{4+2n}O]$. Each R is independently selected from the group consisting of hydrogen, deuterium, halogen, amine group, epoxy group, cyclohexyl epoxy group, acryl group, methacrylic group, thiol group, isocyanate group, nitrile group, nitro group, phenyl group, $C_1$~$C_{12}$ alkyl group, $C_2$~$C_{12}$ alkenyl group, $C_1$~$C_{40}$ alkoxy group, $C_3$~$C_{12}$ cycloalkyl group, $C_3$~$C_{12}$ heterocycloalkyl group, $C_6$~$C_{12}$ aryl group, $C_3$~$C_{12}$ heteroaryl group, $C_3$~$C_{12}$ aralkyl group, $C_3$~$C_{12}$ aryloxy group, and $C_3$~$C_{12}$ aryl thiol group. The phenyl group may be substituted or unsubstituted, and the substituent is any one selected from the group consisting of deuterium, halogen, amine group, epoxy group, cyclohexyl epoxy group, acryl group, methacrylic group, thiol group, isocyanate group, nitrile group, and nitro group.

For example, the base material may include compounds represented by the following Chemical Formulae 1 to 9:

Chemical Formula 1

Chemical Formula 2

Chemical Formula 3

Chemical Formula 4

Chemical Formula 5

Chemical Formula 6

Chemical Formula 7

Chemical Formula 8

-continued

Chemical Formula 9

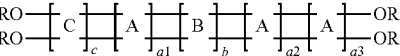

In the Chemical Formulae 1 to 9, each R is independently selected from the group consisting of hydrogen, deuterium, halogen, amine group, epoxy group, cyclohexyl epoxy group, acryl group, methacrylic group, thiol group, isocyanate group, nitrile group, nitro group, phenyl group, $C_1$~$C_{12}$ alkyl group, $C_2$~$C_{12}$ alkenyl group, $C_1$~$C_{40}$ alkoxy group, $C_3$~$C_{12}$ cycloalkyl group, $C_3$~$C_{12}$ heterocycloalkyl group, $C_6$~$C_{12}$ aryl group, $C_3$~$C_{12}$ heteroaryl group, $C_3$~$C_{12}$ aralkyl group, $C_3$~$C_{12}$ aryloxy group, and $C_3$~$C_{12}$ aryl thiol group. The phenyl group may be substituted or unsubstituted, and the substituent is any one selected from the group consisting of deuterium, halogen, amine group, epoxy group, cyclohexyl epoxy group, acryl group, methacrylic group, thiol group, isocyanate group, nitrile group, and nitro group. Each X is independently R or $[(SiO_{3/2}R)_{4+2n}O]$. In addition, a1, a2, a3, a4, b, and c are integers from 1 to 1000.

The hollow particles FIL may be added so as to lower the refractive index of the coating layer HCL. For example, the hollow particles FIL may adjust the refractive index of the coating layer HCL to be in a range of 1.2 to 1.5.

The hollow particles FIL may include at least one selected from the group consisting of hollow silica, hollow acrylic polymer, hollow vinyl polymer, and hollow epoxy polymer. However, the present disclosure is not limited thereto, and the hollow particles FIL may include various suitable materials as long as they can lower the refractive index.

In one or more embodiments, the hollow particles FIL may be hollow silica. The hollow silica may have a particle diameter of 80 nm to 500 nm, and may be included in a concentration greater than 0 and up to 60% with respect to the base material BAS.

In one or more embodiments, the coating layer HCL may further include a radical scavenger as a stabilizer to increase stability. In some embodiments, the coating layer HCL may further include an adhesion promoter to increase adhesion.

The coating layer HCL may include the base material BAS of an organic-inorganic composite material to improve hardness, and may include the hollow particles FIL to exhibit a set or predetermined refractive index.

In another embodiment, the coating layer HCL may further include a dye DYM.

Referring to FIG. 8, the coating layer HCL may include the base material BAS, the hollow particles FIL included in the base material BAS, and the dye DYM.

The dye DYM may block, absorb, or reduce the first color light (e.g., red light), the second color light (e.g., green light), or the third color light (e.g., blue light). Although described herein as the dye, it is not limited thereto and may be a pigment.

Light emitted from the light emitting element layer EL is emitted to the color filter layer CFL through a multilayer structure. Light emitted through the color filter layer CFL may exhibit a set or predetermined color. For example, the light emitted through the color filter layer CFL may exhibit a yellowish, redish, or blueish color, and thus the color may be distorted.

In one or more embodiments, the dye DYM that can block, absorb, or reduce the first color light (e.g., red light), the second color light (e.g., green light), or the third color light (e.g., blue light) may be included in the coating layer HCL. In one or more embodiments, when the light emitted through the color filter layer CFL is yellowish, the coating layer HCL may include a dye capable of absorbing a yellow wavelength band, e.g., a blue dye. When the light emitted through the color filter layer CFL is redish, the coating layer HCL may include a dye capable of absorbing a red wavelength band, e.g., a green dye. When the light emitted through the color filter layer CFL is blueish, the coating layer HCL may include a dye capable of absorbing a blue wavelength band, e.g., a yellow dye.

The dye DYM may be added to the coating layer HCL in a small amount to adjust the color of light. In one or more embodiments, the dye DYM may be included in an amount of greater than 0 and equal to or less than 20% with respect to the entire coating layer HCL. However, because the transmittance may be reduced due to the addition of the dye DYM, the dye DYM may be added in a relatively small amount in consideration of the transmittance.

The coating layer HCL may be a heat curing type (e.g., a heat-curable layer), wherein the coating layer is coated on the substrate SUB and then cured by heating, or a photo-curing type (e.g., a photocurable layer) that further includes a photoinitiator. When using the coating layer HCL of the photocuring type (e.g., a photocurable layer), it is possible to prevent or reduce damage by heat or from warping to the layers therebelow.

The above-described anti-reflection layer LRL may be formed to have a set or predetermined thickness in consideration of transmittance and reflectance. In one or more embodiments, the first inorganic layer INL1 may have a thickness of 50 to 200 nm. The second inorganic layer INL2 may have a thickness of 50 to 200 nm. The coating layer HCL may have a thickness of 50 to 200 nm.

In one or more embodiments, the anti-reflection layer LRL may include the first inorganic layer INL1 of SiON having a refractive index of 1.6 and the second inorganic layer INL2 of SiON having a refractive index of 1.7. In this case, the first inorganic layer INL1 may have a thickness of about 60 nm, the second inorganic layer INL2 may have a thickness of about 140 nm, and the coating layer HCL may have a thickness of about 110 nm.

In one or more other embodiments, the anti-reflection layer LRL may include the first inorganic layer INL1 of SiOx having a refractive index of 1.48 and the second inorganic layer INL2 of SiON having a refractive index of 1.6. In this case, the first inorganic layer INL1 may have a thickness of about 60 nm, the second inorganic layer INL2 may have a thickness of about 120 nm, and the coating layer HCL may have a thickness of about 100 nm.

In one or more other embodiments, the anti-reflection layer LRL may include the first inorganic layer INL1 of SiON having a refractive index of 1.6 and the second inorganic layer INL2 of SiNx having a refractive index of 1.6. In this case, the first inorganic layer INL1 may have a thickness of about 60 nm, the second inorganic layer INL2 may have a thickness of about 130 nm, and the coating layer HCL may have a thickness of about 100 nm.

The above-described anti-reflection layer LRL may include the first inorganic layer INL1, the second inorganic layer INL2, and the coating layer HCL. In the anti-reflection layer LRL, the first inorganic layer INL1 may function as a medium refractive index layer, the second inorganic layer INL2 may function as a high refractive index layer, and the coating layer HCL may function as a low refractive index layer. Because the anti-reflection layer LRL is provided on one surface of the display device 10 on which external light is incident, it is possible to reduce reflection of external light incident on the display device 10 by the above-described anti-reflection layer LRL.

The light emitting element ED included in the above-described light emitting element layer EL may have a structure as shown in FIG. 9.

Referring to FIG. 9, the light emitting element ED which is a particulate element may have a rod and/or cylindrical shape having a set or predetermined aspect ratio. The light emitting element ED may have a size of a nanometer scale (equal to or greater than 1 nm and less than 1 μm) to a micrometer scale (equal to or greater than 1 μm and less than 1 mm). In one or more embodiments, both the diameter and the length of the light emitting element ED may be on a nanometer scale, or on a micrometer scale. In some other embodiments, the diameter of the light emitting element ED may be on a nanometer scale, while the length of the light emitting element ED may be on a micrometer scale. In some embodiments, some of the light emitting elements ED may have a diameter and/or length on a nanometer scale, while some others of the light emitting elements ED may have a diameter and/or length on a micrometer scale.

In one or more embodiments, the light emitting element ED may be an inorganic light emitting diode. For example, the light emitting element ED may include a semiconductor layer doped with any conductivity type (e.g., p-type or n-type) impurities. The semiconductor layer may emit light of a set or specific wavelength band by receiving an electrical signal applied from an external power source.

The light emitting element ED according to one or more embodiments may include a first semiconductor layer 31, a light emitting layer 33, a second semiconductor layer 32, and an electrode layer 37 sequentially stacked in a longitudinal direction. The light emitting element may further include an insulating layer 38 covering the outer surfaces of the first semiconductor layer 31, the second semiconductor layer 32, and the light emitting layer 33.

The first semiconductor layer 31 may be an n-type semiconductor. When the light emitting element ED emits light of a blue wavelength band, the first semiconductor layer 31 may include a semiconductor material having a chemical formula of $Al_xGa_yIn_{1-x-y}N$ (0≤x≤1, 0≤y≤1, 0≤x+y≤1). For example, the first semiconductor layer 31 may be any one or more of n-type doped AlGaInN, GaN, AlGaN, InGaN, AlN and/or InN. The first semiconductor layer 31 may be doped with an n-type dopant, and the n-type dopant may be Si, Ge, Sn, and/or the like. For example, the first semiconductor layer 31 may be n-GaN doped with n-type Si. The length of the first semiconductor layer 31 may have a range of 1.5 μm to 5 μm, but is not limited thereto.

The second semiconductor layer 32 may be on the light emitting layer 33 to be described in more detail herein below. The second semiconductor layer 32 may be a p-type semiconductor. When the light emitting element ED emits light of a blue or green wavelength band, the second semiconductor layer 32 may include a semiconductor material having a chemical formula of $Al_xGa_yIn_{1-x-y}N$ (0≤x≤1, 0≤y≤1, 0≤x+y≤1). For example, it may be any one or more of p-type doped AlGaInN, GaN, AlGaN, InGaN, AlN and/or InN. The second semiconductor layer 32 may be doped with a p-type dopant, and the p-type dopant may be Mg, Zn, Ca, Se, Ba, and/or the like. For example, the second semiconductor layer 32 may be p-GaN doped with p-type Mg. The length of the second semiconductor layer 32 may have a range of 0.05 μm to 0.10 μm, but is not limited thereto.

Although it is illustrated in the drawings that the first semiconductor layer 31 and the second semiconductor layer 32 are configured as one layer, the present disclosure is not limited thereto. Depending on the material of the light emitting layer 33, the first semiconductor layer 31 and the second semiconductor layer 32 may further include a larger number of layers, such as a cladding layer and/or a tensile strain barrier reducing (TSBR) layer.

The light emitting layer 33 may be between the first semiconductor layer 31 and the second semiconductor layer 32. The light emitting layer 36 may include a material having a single or multiple quantum well structure. When the light emitting layer 33 includes a material having a multiple quantum well structure, a plurality of quantum layers and well layers may be stacked alternately. The light emitting layer 33 may emit light by coupling of electron-hole pairs according to an electrical signal applied through the first semiconductor layer 31 and the second semiconductor layer 32. When the light emitting layer 33 emits (e.g., is configured to emit) light of a blue wavelength band, a material such as AlGaN and/or AlGaInN may be included. For example, when the light emitting layer 33 has a structure in which quantum layers and well layers are alternately stacked in a multiple quantum well structure, the quantum layer may include a material such as AlGaN and/or AlGaInN, and the well layer may include a material such as GaN and/or AlInN. For example, as described above, the light emitting layer 33 may include AlGaInN as a quantum layer and AlInN as a well layer, and the light emitting layer 33 may emit blue light having a central wavelength band of 450 nm to 495 nm.

However, the present disclosure is not limited thereto, and the light emitting layer 33 may have a structure in which semiconductor materials having large band gap energy and semiconductor materials having small band gap energy are alternately stacked, and may include other group III to V semiconductor materials according to the wavelength band of the emitted light. The light emitted by the light emitting layer 33 is not limited to light of a blue wavelength band, but the light emitting layer 33 may also emit light of a red or green wavelength band in some embodiments. The length of the light emitting layer 33 may have a range of 0.05 μm to 0.10 μm, but is not limited thereto.

In one or more embodiments, light emitted from the light emitting layer 33 may be emitted to both side surfaces, as well as the outer surface, of the light emitting element ED in the longitudinal direction. The directionality of light emitted from the light emitting layer 33 is not limited to one direction.

The electrode layer 37 may be an ohmic connection electrode. However, the present disclosure is not limited thereto, and it may be a Schottky connection electrode. The light emitting element ED may include at least one electrode layer 37. Although FIG. 9 illustrates that the light emitting element ED includes one electrode layer 37, the present disclosure is not limited thereto. In some embodiments, the light emitting element ED may include a larger number of electrode layers 37, or the electrode layer 37 may be omitted. The following description of the light emitting element ED may be equally applied even if the number of electrode layers 37 is different or further includes other structures.

In the display device 10 according to one or more embodiments, when the light emitting element ED is electrically connected (e.g., electrically coupled) to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and/or indium tin zinc oxide (ITZO). Further, the electrode layer 37 may include an n-type or p-type doped semiconductor material. The electrode layer 37 may include the same material or different materials, but is not limited thereto.

The insulating layer 38 may be arranged to surround the outer surfaces of the plurality of semiconductor layers and electrode layers described above. For example, the insulating layer 38 may be arranged to surround the outer surface of at least the light emitting layer 33, and the light emitting element ED may be elongated in one direction. The insulating film 38 may function to protect the members (e.g., the light emitting layer 33, the first semiconductor layer 31, the second semiconductor layer 32, and/or the electrode layer 37). The insulating layer 38 may be formed to surround side surfaces of the members to expose both ends of the light emitting element ED in the longitudinal direction.

Although it is illustrated in the drawings that the insulating layer 38 extends in the longitudinal direction of the light emitting element ED to cover a region from the first semiconductor layer 31 to the side surface of the electrode layer 37, the present disclosure is not limited thereto. The insulating layer 38 may cover the light emitting layer 33 and only cover the outer surfaces of some semiconductor layers, or may cover only a portion of the outer surface of the electrode layer 37 to partially expose the outer surface of the electrode layer 37. Further, in cross-sectional view (e.g., in a cross-section view taken along an extension direction of the light emitting element ED), the insulating film 38 may have a top surface, which is rounded in a region adjacent to at least one end of the light emitting element ED.

The thickness of the insulating layer 38 may have a range of 10 nm to 1.0 μm, but is not limited thereto. For example, the thickness of the insulating layer 38 may be around 40 nm.

The insulating layer 38 may include materials having insulating properties, for example, silicon oxide (SiOx), silicon nitride (SiNx), silicon oxynitride (SiOxNy), aluminum nitride (AlN), aluminum oxide (AlxOy), and/or the like. Accordingly, it is possible to prevent or reduce an electrical short circuit that may occur when the light emitting layer 33 is in direct contact with the electrode through which the electrical signal is transmitted to the light emitting element ED. In addition, because the insulating layer 38 covers the light emitting layer 33 and protects the outer surface of the light emitting element ED, it is possible to prevent or reduce degradation in light emission efficiency.

Further, the insulating film 38 may have an outer surface which is surface-treated. The light emitting elements ED may be aligned by spraying the ink in which the light emitting elements ED are dispersed on the electrodes. Here, the surface of the insulating film 38 may be treated in a hydrophobic or hydrophilic manner to keep the light emitting elements ED in a dispersed state without (or substantially without) aggregation with other light emitting elements ED adjacent in the ink. For example, the insulating layer 38 may be surface-treated on the outer surface thereof with a material such as stearic acid and/or 2,3-naphthalene dicarboxylic acid.

Hereinafter, other embodiments will be described. In the following embodiments, a redundant description of the same components as in the above-described embodiments will not be provided or will be simplified, and differences will be mainly described.

FIG. 10 is a cross-sectional view schematically illustrating a display device according to one or more other embodiments.

Referring to FIG. 10, the display device 10 according to the present embodiment is different from the above-described embodiment with reference to FIGS. 2 to 9 in that an organic light emitting diode is included as the light emitting element layer EL.

For example, the display device 10 may include the light emitting element layer EL on the circuit layer CCL of the substrate SUB. The light emitting element layer EL may include a pixel electrode PXE, a pixel defining layer PDL, a light emitting layer EML, and a common electrode CME.

The pixel electrode PXE may be in each sub-pixel SPX1, SPX2, SPX3. The pixel electrodes PXE may each have an island shape, and may be in the sub-pixels SPX1, SPX2, and SPX3 to be separated from each other. The pixel electrode PXE may be electrically connected (e.g., electrically coupled) to a transistor of the circuit layer CCL to receive a driving signal.

The pixel electrode PXE may be a first electrode (e.g., an anode electrode) of an organic light emitting diode. The pixel electrode PXE may have a stacked structure formed by stacking a material layer having a high work function, such as indium tin oxide (ITO), indium zinc oxide (IZO), zinc oxide (ZnO) and/or indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. The material layer having a high work function may be above the reflective material layer and closer to a light emitting layer EML. The pixel electrode PXE may have a multilayer structure such as ITO/Mg, ITO/MgF, ITO/Ag, and/or ITO/Ag/ITO, but is not limited thereto.

The pixel defining layer PDL may be on a boundary between adjacent ones of the sub-pixels SPX1, SPX2, and SPX3, above the substrate SUB. The pixel defining layer PDL may include portions extending in the first direction DR1 and the second direction DR2 in a plan view, and thus may be arranged in a grid pattern. The bank BNL may be positioned along the boundaries between adjacent ones of the sub-pixels SPX1, SPX2, and SPX3 to delimit the neighboring sub-pixels SPX1, SPX2, and SPX3. The pixel defining layer PDL may be on the pixel electrode PXE and may include an opening to expose the pixel electrode PXE. The emission area EMA and the non-emission area NEA may be partitioned and defined by the opening of the pixel defining layer PDL. The pixel defining layer PDL may overlap the bank BNL and may also overlap the first light blocking member BK1.

The pixel defining layer PDL may include an organic insulating material such as acrylic resin, epoxy resin, phenolic resin, polyamide resin, polyimide resin, unsaturated polyester resin, polyphenylene resin, polyphenylenesulfide resin, and/or benzocyclobutene (BCB). The pixel defining layer PDL may include an inorganic material.

The light emitting layer EML may be on the pixel electrode PXE exposed by the pixel defining layer PDL. In one or more embodiments in which the display device 10 is an organic light emitting display, the light emitting layers EML may include an organic layer having an organic material. The organic layer may have an organic light emitting layer, and in some embodiments, may further have at least one of a hole injection layer, a hole transport layer, an electron transport layer, and/or an electron injection layer as an auxiliary layer for light emission.

In some embodiments, the light emitting layers EML may have a tandem structure in which a plurality of organic light emitting layers are superposed in the thickness direction, and a charge generation layer is between the organic light emitting layers. The respective superposed organic light emitting layers may emit light of the same wavelength, or may emit light of different wavelengths. At least a portion of the light emitting layer EML of each of the sub-pixels SPX1, SPX2, and SPX3 may be separated from the same layer of the neighboring sub-pixel SPX1, SPX2, SPX3.

In one or more embodiments, the wavelengths of light emitted from the respective light emitting layers EML may be the same for all of the sub-pixels SPX1, SPX2, and SPX3. For example, the light emitting layer EML of each sub-pixel SPX1, SPX2, and SPX3 may emit blue light, and light of a different color may be emitted from each sub-pixel SPX1, SPX2, SPX3 due to the wavelength control layer CWL.

The common electrode CME may be on the light emitting layer EML. The common electrode CME may be in contact with the light emitting layers EML of the sub-pixels SPX1, SPX2, and SPX3, as well as the top surface of the pixel defining layer PDL. The common electrode CME may be continuous across the sub-pixels SPX1, SPX2, and SPX3. The common electrode CME may be a full surface electrode positioned over the entire surface across all the sub-pixels SPX1, SPX2, and SPX3. The common electrode CME may be a second electrode (e.g., a cathode electrode) of an organic light emitting diode.

The common electrode CME may include a material layer having a low work function, such as Li, Ca, LiF/Ca, LiF/Al, Al, Mg, Ag, Pt, Pd, Ni, Au Nd, Ir, Cr, BaF, Ba, a compound thereof, or a mixture thereof (e.g., a mixture of Ag and Mg). The common electrode CME may further include a transparent metal oxide layer on the material layer having a low work function.

The pixel electrode PXE, the light emitting layer EML, and the common electrode CME may constitute a light emitting element (e.g., an OLED). Light emitted from the light emitting layer EML may be emitted in an upward direction (e.g., the third direction DR3) through the common electrode CME.

In one or more embodiments, the light emitting element layer EL may further include a passivation layer PSS on the common electrode CME. The passivation layer PSS may prevent or reduce contamination and damage to the lower light emitting element layer EL. The passivation layer PSS may include an inorganic material, and may include silicon nitride (SiNx), silicon oxide (SiOx), silicon oxynitride (SiOxNy), and/or the like. The passivation layer PSS may be formed of a single layer or multiple layers, and when formed of multiple layers, may include an organic layer made of at least one organic material. The organic layer (e.g., organic film) may include an organic insulating material such as acrylic resin, epoxy resin, phenolic resin, polyamide resin, polyimide resin, unsaturated polyester resin, polyphenylene resin, polyphenylenesulfide resin, and/or benzocyclobutene (BCB).

The bank BNL, the wavelength control layer CWL, the protective layer PRL, the color filter layer CFL, and the anti-reflection layer LRL may be on the passivation layer PSS.

In the present embodiment, when an organic light emitting diode is applied as the light emitting element layer EL, the anti-reflection layer LRL may be included on the uppermost portion, thereby reducing reflection of external light and preventing or reducing physical damage to the display device 10.

Hereinafter, one or more embodiments in which the anti-reflection layer LRL is applied to a tiled display device will be described.

FIG. 11 is a plan view illustrating a tiled display device according to one or more embodiments. FIG. 12 is a cross-sectional view taken along the line Q5-Q5' of FIG. 11.

Referring to FIG. 11, a tiled display device TD may include a plurality of display devices 10. The plurality of display devices 10 may be arranged in a grid form, but are not limited thereto. The plurality of display devices 10 may be connected in the first direction DR1 and/or the second direction DR2, and the tiled display device TD may have a set or particular shape. For example, the plurality of display devices 10 may have the same size, but are not limited thereto. For another example, the plurality of display devices 10 may have different sizes.

Each of the plurality of display devices 10 may have a rectangular shape including long sides and short sides. The plurality of display devices 10 may be arranged such that the long sides and/or the short sides thereof are connected to each other. Some of the display devices 10 may be at the edge of the tiled display device TD to form one side of the tiled display device TD. Some others of the display devices 10 may be at corners of the tiled display device TD to form two adjacent (e.g., connected) sides of the tiled display device TD. Yet some others of the display devices 10 may be on the inner portion of the tiled display device TD, and may be surrounded by other display devices 10.

The tiled display device TD may have a planar shape as a whole, but is not limited thereto. The tiled display device TD may have a three-dimensional shape to provide a three-dimensional effect to a user. For example, when the tiled display device TD has a three-dimensional shape, at least some of the plurality of display devices 10 may have a curved shape. For another example, the plurality of display devices 10 may each have a planar shape and may be connected to each other at a set or predetermined angle, so that the tiled display device TD may have a three-dimensional shape.

The tiled display device TD may include a coupling area SM between a plurality of display areas DA. The tiled display device TD may be formed by connecting non-display areas NDA of the adjacent display devices 10. The plurality of display devices 10 may be connected to each other through a bonding member or an adhesive member provided in the coupling area SM. Each of the coupling areas SM of the plurality of display devices 10 may not include a pad member or a flexible film attached to the pad member. Accordingly, the distance between the display areas DA of the plurality of display devices 10 may be small enough that the coupling area SM between the plurality of display devices 10 is not recognized by the user. In addition, the reflectance of external light of the display areas DA of the plurality of display devices 10 may be substantially the same as that of the coupling area SM between the plurality of display devices 10. Accordingly, in the tiled display device TD, recognition by the user of the coupling area SM between the plurality of display devices 10 may be prevented or reduced, thereby reducing a sense of disconnection between the plurality of display devices 10 and improving a sense of immersion in an image.

Referring to FIG. 12 in conjunction with FIG. 11, the tiled display device TD according to one or more embodiments may include a plurality of display devices 10_1 and 10_2 and a bonding member 20 that bonds them. The tiled display device TD may include the display area DA of a first display device 10_1, the display area DA of a second display device 10_2, and the coupling area SM between the display areas DA of the first and second display devices 10_1 and 10_2.

The first display device 10_1 may include a first substrate SUB1, and the second display device 10_2 may include a second substrate SUB2. Each of the display devices 10_1 and 10_2 may include the circuit layer CCL, the light emitting element layer EL, the wavelength control layer CWL, the color filter layer CFL, and the anti-reflection layer LRL on its own substrate SUB1, SUB2. Since the circuit layer CCL, the light emitting element layer EL, the wavelength control layer CWL, the color filter layer CFL, and the anti-reflection layer LRL have been described above, redundant descriptions thereof will not be provided.

The tiled display device TD may bond the side surfaces of the adjacent display devices 10_1 and 10_2 to each other by using the bonding member 20 between the plurality of display devices 10_1 and 10_2. The bonding member 20 may connect the side surfaces of the plurality of display devices arranged in a grid form to implement the tiled display device TD. The bonding member 20 may bond the side surfaces of the substrates SUB1 and SUB2 and the side surfaces of the coating layers HCL of the anti-reflection layers LRL in the display devices 10_1 and 10_2 adjacent to each other.

For example, the bonding member 20 may be made of an adhesive or a double-sided tape having a relatively thin thickness to minimize or reduce the gap between the plurality of display devices 10_1 and 10_2. In some embodiments, the bonding member 20 may be formed of a bonding frame having a relatively thin thickness to minimize or reduce the gap between the plurality of display devices 10_1 and 10_2. Accordingly, in the tiled display device TD, it is possible to prevent or reduce recognition by the user of the coupling area SM between the plurality of display devices 10.

In one or more embodiments, the anti-reflection layer LRL is formed on each of the display devices 10_1 and 10_2 by coating or deposition. When the anti-reflection layer LRL is formed in the form of a film, a gap between the plurality of display devices 10_1 and 10_2 may be too wide due to a tolerance caused by attachment and cutting of the film on each of the display devices 10_1 and 10_2. In the present embodiments, because the anti-reflection layer LRL is formed by coating or deposition, a gap (e.g., the coupling area) between the plurality of display devices 10_1 and 10_2 may be minimized or reduced.

Hereinafter, embodiments will be described in more detail through preparation examples, experimental examples and simulations.

Preparation Example 1: Preparation of a Coating Layer Sample

A coating layer sample was prepared by coating a solution in which a POSS-based compound having the following chemical formula and a solvent were mixed on a glass substrate:

Experimental Example 1

Scuff evaluation was performed on the surface of the prepared coating layer sample. Scuff evaluation involves checking a scratch level by performing 10 reciprocating motions on the surface of the coating layer sample in a state where a weight of 1.5 kg is placed on No. 0000 steel-wool. In addition, the above-described Scuff evaluation was also performed on an extremely (e.g., comparably) low reflection film (ELR Film) commercially available as an anti-reflection film.

After performing Scuff evaluation of the ELR film and the coating layer sample, images of their respective surfaces observed under a microscope are shown in FIGS. 13 and 14, respectively. FIG. 13 is a surface image of an ELR film. FIG. 14 is a surface image of a coating layer sample.

Referring to FIG. 13, a plurality of scratches were observed in a horizontal direction on the surface of the ELR film. In contrast, referring to FIG. 14, no visible scratches were observed in the coating layer sample.

Based on the results of Experimental Example 1, it is believed that the hardness of the prepared coating layer is significantly superior to that of the ELR film.

Simulation: Measuring Reflectance of the Anti-Reflection Layer for Each Wavelength Band A simulation was performed to measure reflectance for each wavelength band by varying the material, refractive index and thickness of the anti-reflection layer.

In Sample #1, SiON having a refractive index of 1.6 was formed to have a thickness of 60 nm on a glass substrate, SiON having a refractive index of 1.7 was formed thereon to have a thickness of 140 nm, and a coating layer having a refractive index of 1.27 was formed thereon to have a thickness of 110 nm. Here, the coating layer was formed by including about 60% of 90 nm-sized hollow silica in the coating layer prepared in Preparation Example 1 described above.

In Sample #2, SiOx having a refractive index of 1.48 was formed to have a thickness of 60 nm on a glass substrate, SiON having a refractive index of 1.6 was formed thereon to have a thickness of 120 nm, and a coating layer having a refractive index of 1.27 was formed thereon to have a thickness of 100 nm. Here, the coating layer was formed in the same manner as in Sample #1.

Sample #3 was formed in the same manner as Sample #2, except that SiON having a refractive index of 1.6 was formed to have a thickness of 60 nm on a glass substrate, and SiNx having a refractive index of 1.86 was formed thereon to have a thickness of 130 nm.

The reflectance for each wavelength band between 380 nm and 780 nm was measured for the prepared Samples #1, #2, and #3, and is shown in FIG. 15. FIG. 15 is a graph showing reflectance for each wavelength band between 380 nm and 780 nm for Samples #1, #2, and #3.

Referring to FIG. 15, Samples #1, #2, and #3 each showed zero reflectance in a wavelength band of 550 nm, and exhibited reflectance of about 3.5% or less overall. In particular, it was confirmed that the reflectance was 0 in the 550 nm wavelength band which is recognized by the human eye.

Preparation Example 2: Preparation of a Substrate Sample Including a Color Filter Layer and an Anti-Reflection Layer A color filter layer including light blocking members and a red color filter, a green color filter, and a blue color filter between the light blocking members was formed on a glass substrate. Anti-reflection layers having the following conditions were respectively formed on the color filter layer.

In Sample #4, SiON having a refractive index of 1.6 was formed to have a thickness of 53 nm on the color filter layer, SiON having a refractive index of 1.7 was formed thereon to have a thickness of 130 nm, and the coating layer of Sample #1 was formed thereon to have a thickness of 97 nm.

Sample #5 was formed in the same manner as in Sample #4 except that the coating layer was formed to have a thickness of 109 nm.

Sample #6 was formed in the same manner as in Sample #4 except that the coating layer was formed to have a thickness of 118 nm.

As Comparative Example, the ELR film of Experimental Example 1 was attached onto the color filter layer.

The reflectance for each wavelength band in substrate samples prepared according to the above-described Samples #4, #5, and #6 and Comparative Example was measured and is shown in FIG. 16. In addition, SCI (Specular Component Included), SCE (Specular Component Excluded), and SC (Specular Component) of the substrate samples prepared according to Samples #4, #5, and #6 and Comparative Example were measured and are shown in Table 1 below. Here, SCI is the total reflection and diffuse reflection value, SCE is the diffuse reflection value, and SC is the total reflection value. FIG. 16 is a graph showing reflectance for each wavelength band in substrate samples prepared according to Samples #4, #5, and #6 and Comparative Example.

TABLE 1

|  | Sample #4 | Sample #5 | Sample #6 | Comparative Example |
|---|---|---|---|---|
| SCI | 1.51 | 1.10 | 0.96 | 1.08 |
| SCE | 0.33 | 0.34 | 0.34 | 0.34 |
| SC | 1.17 | 0.76 | 0.62 | 0.75 |

First, referring to Table 1, the substrates of Samples #4, #5, and #6 exhibited SCI, SCE, and SC values at substantially the same level as that of Comparative Example.

In addition, referring to FIG. 16, the substrates of Samples #4, #5, and #6 exhibited reflectance substantially at the same level as that of Comparative Example for each wavelength band.

Based these results, it is believed that the anti-reflection layer formed by deposition and coating exhibited the same level of reflectance characteristics as the conventional ELR film in the form of a film.

In concluding the detailed description, those skilled in the art will appreciate that many variations and modifications can be made to the embodiments described herein without substantially departing from the principles of the present disclosure as set forth in the following claims and their equivalents. Therefore, the disclosed embodiments are used in a generic and descriptive sense only and not for purposes of limitation.

What is claimed is:

1. A display device comprising:
   a light emitting element layer on a substrate and configured to emit light;
   a wavelength control layer on the light emitting element layer and configured to convert a wavelength of the light;
   a color filter layer on the wavelength control layer; and
   an anti-reflection layer on the color filter layer,
   wherein the anti-reflection layer comprises:

a first inorganic layer directly on the color filter layer, the first inorganic layer comprising silicon oxide or silicon nitroxide;
   a second inorganic layer on the first inorganic layer; and
   a coating layer on the second inorganic layer and comprising a dye,
   wherein a refractive index of the first inorganic layer is smaller than or equal to a refractive index of the second inorganic layer, and
   wherein the wavelength control layer is disposed between the light emitting element layer and the color filter layer.

2. The display device of claim 1, wherein the refractive index of the first inorganic layer is 1.4 to 1.6, and the refractive index of the second inorganic layer is 1.6 to 2.2.

3. The display device of claim 1, wherein the refractive index of the second inorganic layer is greater than a refractive index of the coating layer.

4. The display device of claim 3, wherein the refractive index of the coating layer is 1.2 to 1.5.

5. The display device of claim 1, wherein the second inorganic layer comprises silicon nitride or silicon nitroxide.

6. The display device of claim 1, wherein the coating layer comprises a base material comprising a polyhedral oligomeric silsesquioxane (POSS)-based organic-inorganic composite material and hollow particles in the base material.

7. The display device of claim 6, wherein the base material comprises at least one selected from the group consisting of Chemical Formulae A, B, and C:

Chemical Formula A

Chemical Formula B

Chemical Formula C where X is independently R or $[(SiO_{3/2}R)_{4+2n}O]$,

R is independently selected from the group consisting of hydrogen, deuterium, halogen, amine group, epoxy group, cyclohexyl epoxy group, acryl group, methacrylic group, thiol group, isocyanate group, nitrile group, nitro group, phenyl group, $C_1\sim C_{12}$ alkyl group, $C_2\sim C_{12}$ alkenyl group, $C_1\sim C_{40}$ alkoxy group, $C_3\sim C_{12}$ cycloalkyl group, $C_3\text{\textasciitilde}C_{12}$ heterocycloalkyl group, $C_6\text{\textasciitilde}C_{12}$ aryl group, $C_3\text{\textasciitilde}C_{12}$ heteroaryl group, $C_3\text{\textasciitilde}C_{12}$ aralkyl group, $C_3\text{\textasciitilde}C_{12}$ aryloxy group, and $C_3\text{\textasciitilde}C_{12}$ aryl thiol group, the phenyl group being substituted or unsubstituted, and the substituent being selected from the group consisting of deuterium, halogen, amine group, epoxy group, cyclohexyl epoxy group, acryl group, methacrylic group, thiol group, isocyanate group, nitrile group, and nitro group.

8. The display device of claim 7, wherein the base material comprises any of compounds represented by Chemical Formulas 1 to 9:

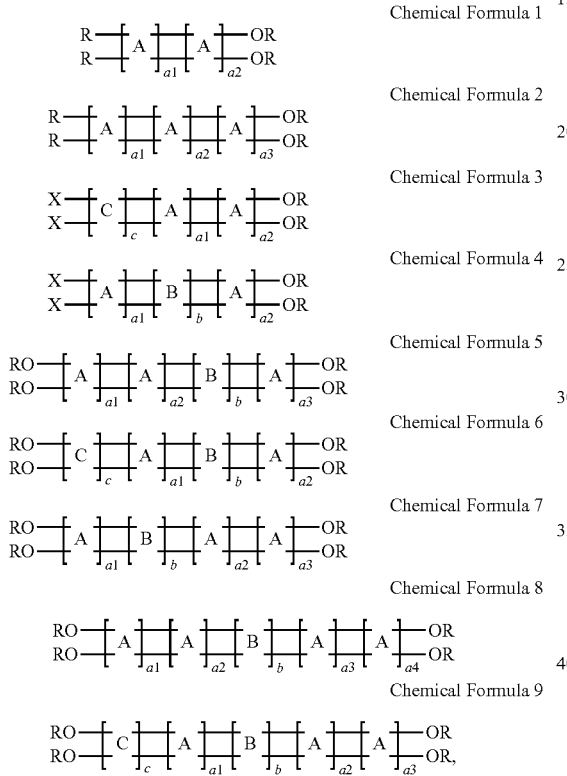

Chemical Formula 1

Chemical Formula 2

Chemical Formula 3

Chemical Formula 4

Chemical Formula 5

Chemical Formula 6

Chemical Formula 7

Chemical Formula 8

Chemical Formula 9 where R is independently selected from the group consisting of hydrogen, deuterium, halogen, amine group, epoxy group, cyclohexyl epoxy group, acryl group, methacrylic group, thiol group, isocyanate group, nitrile group, nitro group, phenyl group, $C_1\text{\textasciitilde}C_{12}$ alkyl group, $C_2\text{\textasciitilde}C_{12}$ alkenyl group, $C_1\text{\textasciitilde}C_{40}$ alkoxy group, $C_3\text{\textasciitilde}C_{12}$ cycloalkyl group, $C_3\text{\textasciitilde}C_{12}$ heterocycloalkyl group, $C_6\text{\textasciitilde}C_{12}$ aryl group, $C_3\text{\textasciitilde}C_{12}$ heteroaryl group, $C_3\text{\textasciitilde}C_{12}$ aralkyl group, $C_3\text{\textasciitilde}C_{12}$ aryloxy group, and $C_3\text{\textasciitilde}C_{12}$ aryl thiol group, the phenyl group being substituted or unsubstituted, and the substituent being selected from the group consisting of deuterium, halogen, amine group, epoxy group, cyclohexyl epoxy group, acryl group, methacrylic group, thiol group, isocyanate group, nitrile group, and nitro group, X is independently R or $[(SiO_{3/2}R)_{4+2n}O]$, and a1, a2, a3, a4, b, and c are each an integer from 1 to 1000.

9. The display device of claim 6, wherein the hollow particles comprise at least one selected from the group consisting of hollow silica, hollow acrylic polymer, hollow vinyl polymer, and hollow epoxy polymer.

10. The display device of claim 1, wherein each of the first inorganic layer, the second inorganic layer, and the coating layer has a thickness of 50 to 200 nm.

11. The display device of claim 1, further comprising a circuit layer comprising at least one transistor between the substrate and the light emitting element layer.

12. The display device of claim 1, wherein the light emitting element layer comprises:

a first electrode and a second electrode on the substrate and extending in one direction;

a light emitting element having a first end and a second end thereof on the first electrode and the second electrode, respectively; and a first connection electrode in contact with the first end of the light emitting element and a second connection electrode in contact with the second end of the light emitting element.

13. The display device of claim 1, wherein the light emitting element layer comprises:

a pixel electrode on the substrate;

a light emitting layer on the pixel electrode; and a common electrode on the light emitting layer.

14. A tiled display device comprising:

a plurality of display devices adjacent to each other; and a bonding member on adjacent side surfaces of the plurality of display devices, wherein each of the plurality of display devices comprises:

a light emitting element layer on a substrate and configured to emit light;

a wavelength control layer on the light emitting element layer and configured to convert a wavelength of the light;

a color filter layer on the wavelength control layer; and an anti-reflection layer on the color filter layer and comprising a first inorganic layer directly on the color filter layer, a second inorganic layer on the first inorganic layer, and a coating layer on the second inorganic layer, the coating layer comprising a dye, wherein the first inorganic layer comprises silicon oxide or silicon nitroxide, wherein a refractive index of the first inorganic layer is smaller than or equal to a refractive index of the second inorganic layer, and wherein the wavelength control layer is disposed between the light emitting element layer and the color filter layer.

15. The tiled display device of claim 14, wherein the bonding member is configured to bond side surfaces of the respective coating layers of the plurality of display devices.

16. The tiled display device of claim 14, wherein the refractive index of the first inorganic layer is 1.4 to 1.6, and the refractive index of the second inorganic layer is 1.6 to 2.2.

17. The tiled display device of claim 16, wherein the refractive index of the second inorganic layer is greater than a refractive index of the coating layer, and the refractive index of the coating layer is 1.2 to 1.5.

18. The tiled display device of claim 14, wherein the second inorganic layer comprises silicon nitride or silicon nitroxide.

19. The tiled display device of claim 14, wherein the coating layer comprises a base material comprising a polyhedral oligomeric silsesquioxane (POSS)-based organic-inorganic composite material and hollow particles in the base material.

* * * * *